(12) United States Patent
Yang et al.

(10) Patent No.: US 12,464,789 B2
(45) Date of Patent: Nov. 4, 2025

(54) SEMICONDUCTOR DEVICE STRUCTURE AND METHOD FOR FORMING THE SEMICONDUCTOR DEVICE STRUCTURE

(71) Applicant: Taiwan Semiconductor Manufacturing Company, Ltd., Hsinchu (TW)

(72) Inventors: Wen-Yao Yang, Taoyuan (TW); Chia-Wei Chen, Hsinchu (TW); Wei-Cheng Hsu, Chiayi (TW); Jo-Chun Hung, Hsinchu (TW); Yung-Hsiang Chan, Taichung (TW); Hui-Chi Chen, Zhudong Township, Hsinchu County (TW); Yen-Ta Lin, Taipei (TW); Te-Fu Yeh, Kaohsiung (TW); Yun-Chen Wu, Hsinchu (TW); Yen-Ju Chen, Hsinchu (TW); Chih-Ming Sun, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 626 days.

(21) Appl. No.: 17/691,335

(22) Filed: Mar. 10, 2022

(65) Prior Publication Data
US 2023/0290824 A1     Sep. 14, 2023

(51) Int. Cl.
| | | |
|---|---|---|
| *H10D 62/10* | (2025.01) | |
| *H01L 21/306* | (2006.01) | |
| *H10D 30/67* | (2025.01) | |
| *H10D 84/01* | (2025.01) | |
| *H10D 84/03* | (2025.01) | |

(52) U.S. Cl.
CPC ..... *H10D 62/121* (2025.01); *H01L 21/30604* (2013.01); *H10D 30/6735* (2025.01); *H10D 84/0158* (2025.01); *H10D 84/038* (2025.01)

(58) Field of Classification Search
CPC ............. H10D 62/121; H10D 84/0158; H10D 30/6735; H10D 84/038
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |

(Continued)

*Primary Examiner* — Richard A Booth
(74) *Attorney, Agent, or Firm* — Birch, Stewart, Kolasch & Birch, LLP

(57) ABSTRACT

A method for forming a semiconductor device structure includes forming first nanostructures and second nanostructures over a substrate. The method also includes forming a first metal gate layer surrounding the first nanostructures and over the first nanostructures and the second nanostructures. The method also includes etching back the first metal gate layer over the first nanostructures and the second nanostructures. The method also includes removing the first metal gate layer over the second nanostructures. The method also includes forming a second metal gate layer surrounding the second nanostructures and over the first nanostructures and the second nanostructures.

20 Claims, 31 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 2021/0057541 A1* | 2/2021 | Huang .................. H10D 64/017 |
| 2021/0135011 A1* | 5/2021 | Ju ..................... H01L 21/31055 |

* cited by examiner

SEMICONDUCTOR DEVICE STRUCTURE AND METHOD FOR FORMING THE SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-1, 3A-2, 3B-1, 3B-2, 3C-1, 3C-2, 3D-1, 3D-2, 3E-1, 3E-2, 3F-1, 3F-2, 3G-1, 3G-2 are cross-sectional representations of various stages of forming a semiconductor device structure, in accordance with some embodiments of the disclosure.

FIGS. 4A-1, 4A-2, 4B-1, 4B-2, 4C-1, 4C-2 are cross-sectional representations of various stages of forming a semiconductor device structure, in accordance with some embodiments of the disclosure.

FIGS. 6A-1, 6A-2, 6B-1, 6B-2 are cross-sectional representations of various stages of forming a semiconductor device structure, in accordance with some embodiments of the disclosure.

DETAILED DESCRIPTION

Figure 1:
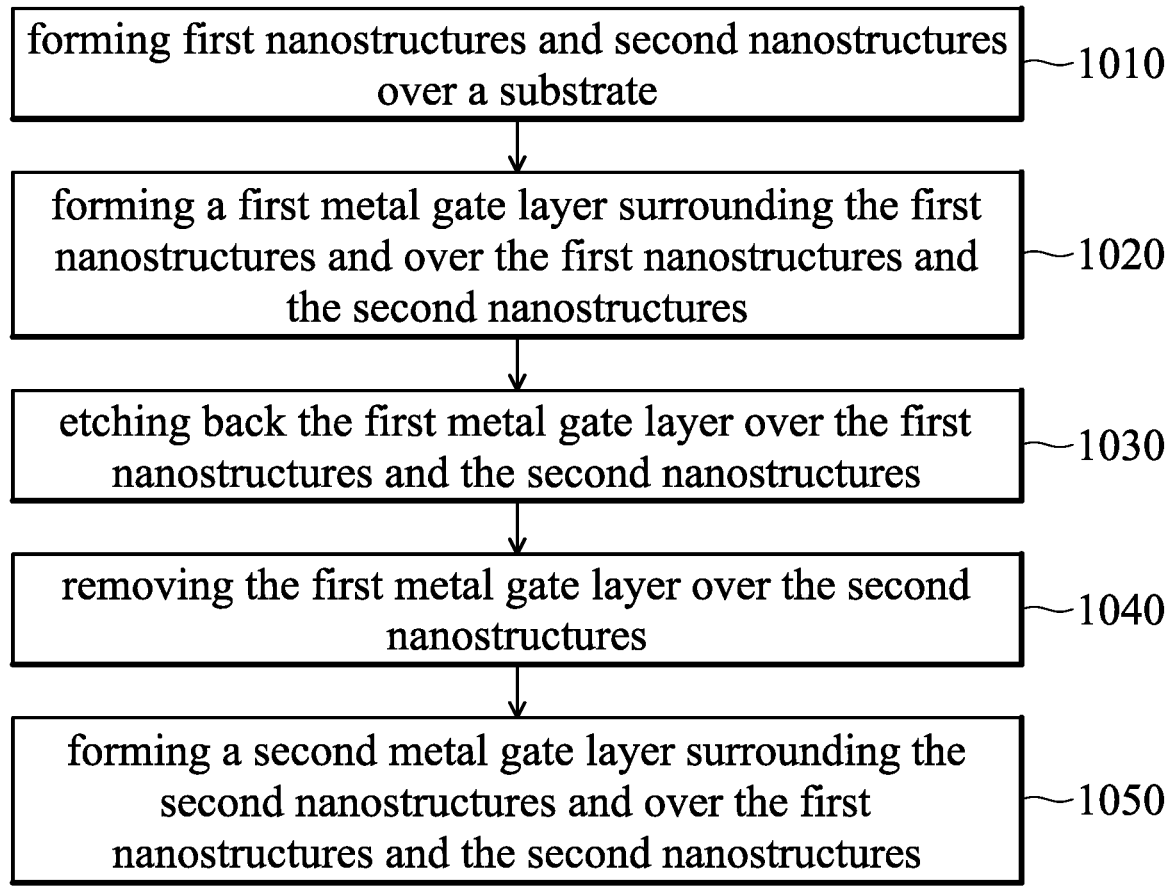
FIG. 1 is a flow chart of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The method for forming the semiconductor device structure may include pulling back the metal gate layer with the first conductivity type before depositing the metal gate layer with the second conductivity type. In this way, only metal gate layer with the second conductivity type is etched when etching back the metal gate layer. Therefore, it may be easier to control the metal gate height and the yield may be improved.

FIG. 1 is a flow chart of forming the semiconductor device structure 10*a*, in accordance with some embodiments of the disclosure. FIGS. 2A-2E are perspective representations of various stages of forming a semiconductor device structure 10*a*, in accordance with some embodiments of the disclosure. The semiconductor device structure 10*a* may be a gate all around (GAA) transistor structure. FIGS. 3A-1, 3A-2, 3B-1, 3B-2, 3C-1, 3C-2, 3D-1, 3D-2, 3E-1, 3E-2, 3F-1, 3F-2, 3G-1, 3G-2 are cross-sectional representations of various stages of forming a semiconductor device structure 10*a*, in accordance with some embodiments of the disclosure. FIGS. 3A-1, 3B-1, 3C-1, 3D-1, 3E-1, 3F-1, 3G-1 show cross-sectional representations taken along line 1-1 in FIG. 2A. FIGS. 3A-2, 3B-2, 3C-2, 3D-2, 3E-2, 3F-2, 3G-2 show cross-sectional representations taken along line 2-2 in FIG. 2A.

Figure 2A:
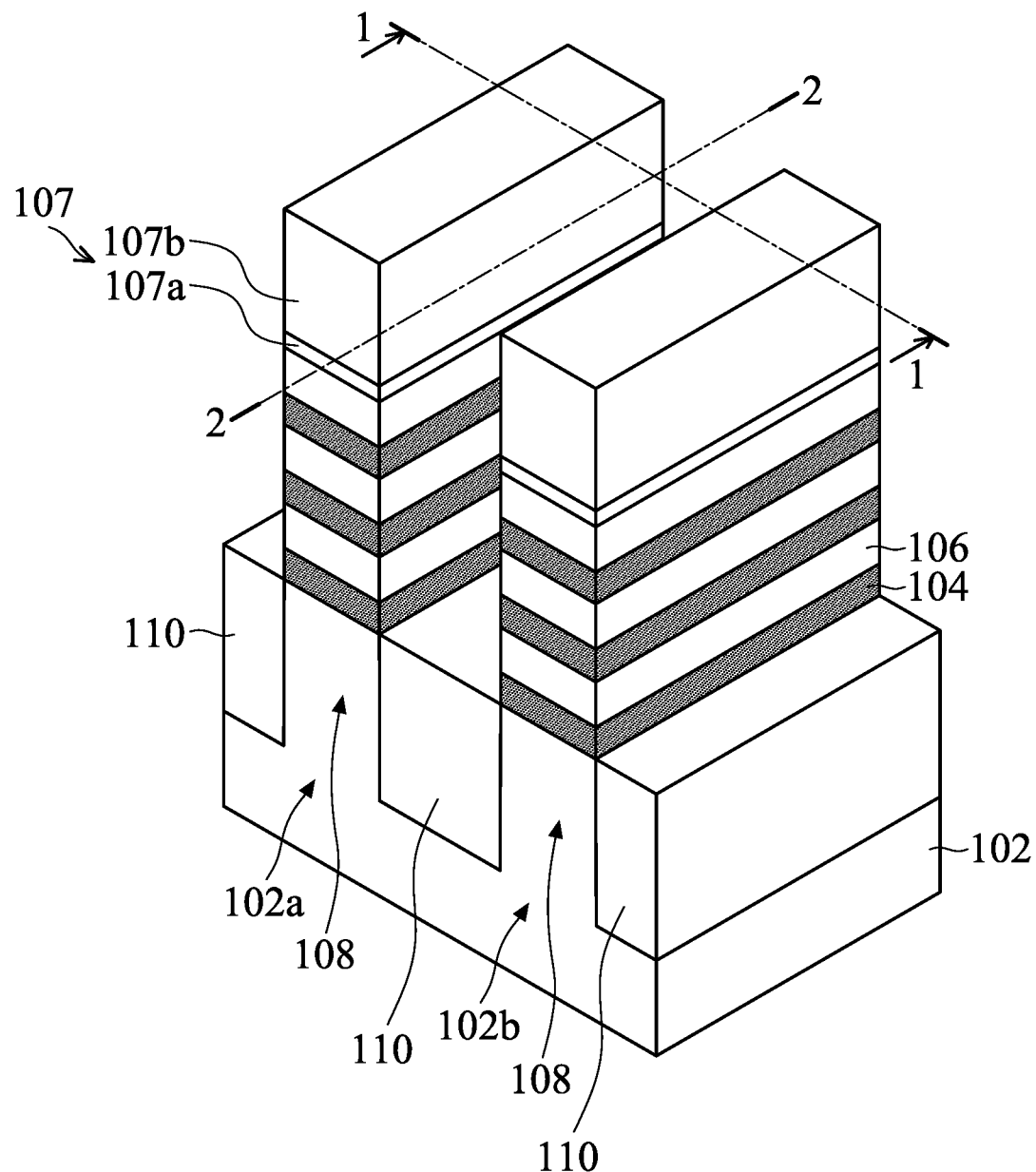
FIGS. 2A-2E are perspective representations of various stages of forming a semiconductor device structure, in accordance with some embodiments of the disclosure.

A substrate 102 is provided as shown in FIG. 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate. In some embodiments, the substrate 102 includes a first region 102a and a second region 102b. Different types of devices may be formed in the first region 102a and the second region 102b of the substrate 102, respectively.

Next, first semiconductor layers 104 and second semiconductor layers 106 are alternating stacked over the substrate 102, as shown in FIG. 2A in accordance with some embodiments. The first semiconductor layers 104 and the second semiconductor layers 106 may include Si, Ge, SiGe, GaAs, InSb, GaP, GaSb, InAlAs, InGaAs, GaSbP, GaAsSb, or InP. The first semiconductor layers 104 and second semiconductor layers 106 may be made of different materials with different etching rates. In some embodiments, for example, the first semiconductor layers 104 are SiGe and the second semiconductor layers 106 are Si.

The first semiconductor layers 104 and second semiconductor layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor layers 104 and three layers of the second semiconductor layers 106 shown in FIG. 2A, the number of the first semiconductor layers 104 and second semiconductor layers 106 are not limited herein, depending on the demand of performance and process.

Next, a mask structure 107 may be formed and patterned over the first semiconductor layers 104 and the second semiconductor layers 106, as shown in FIG. 2A in accordance with some embodiments. The mask structure 107 may be a multilayer structure including a pad layer 107a and a hard mask layer 107b formed over the pad layer 107a. The pad layer 107a may be made of silicon oxide, which may be formed by thermal oxidation or CVD. The hard mask layer 107b may be made of silicon nitride, which may be formed by CVD, such as LPCVD or plasma-enhanced CVD (PECVD). The first semiconductor layers 104 and second semiconductor layers 106 may be patterned to form fin structures 108 using the patterned mask structure 107 as a mask layer. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 108 are formed, a liner layer may be formed in the trenches between the fin structures 108 (not shown). The liner layer may be conformally formed over the substrate 102, the fin structure 108, and the mask structure covering the fin structure 108. The liner layer may be used to protect the fin structure 108 from being damaged in the following processes (such as an anneal process or an etching process). The liner layer may be made of silicon nitride. The liner layer may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 110 may be then filled over the liner layer in the trenches between the fin structures 108, as shown in FIG. 2A in accordance with some embodiments. The isolation structure 110 may be made of silicon oxide, silicon nitride, silicon oxynitride, fluoride-doped silicate glass (FSG), or another low-k dielectric material. The isolation structure 110 may be deposited by a deposition process, such as a chemical vapor deposition (CVD) process, a spin-on-glass process, or another applicable process.

Next, an etching process may be performed on the isolation structure 110 and the liner layer. The etching process may be used to remove the top portion of the liner layer and the top portion of the isolation structure 110. As a result, the first semiconductor layers 104 and the second semiconductor layers 106 may be exposed and the remaining isolation structure 110 and the liner layer may surround the base portion of the fin structure 108. The remaining isolation structure 110 may be a shallow trench isolation (STI) structure surrounding the base portion of the fin structure 108. The isolation structure 110 may be configured to prevent electrical interference or crosstalk. Therefore, trenches may be formed between the fin structures 108.

Next, a semiconductor liner layer (not shown) may be formed over the fin structures 108. The semiconductor liner 111 may be a Si layer and may be incorporated into the subsequently formed cladding layer during the epitaxial growth process for forming the cladding layer.

Figure 2B:
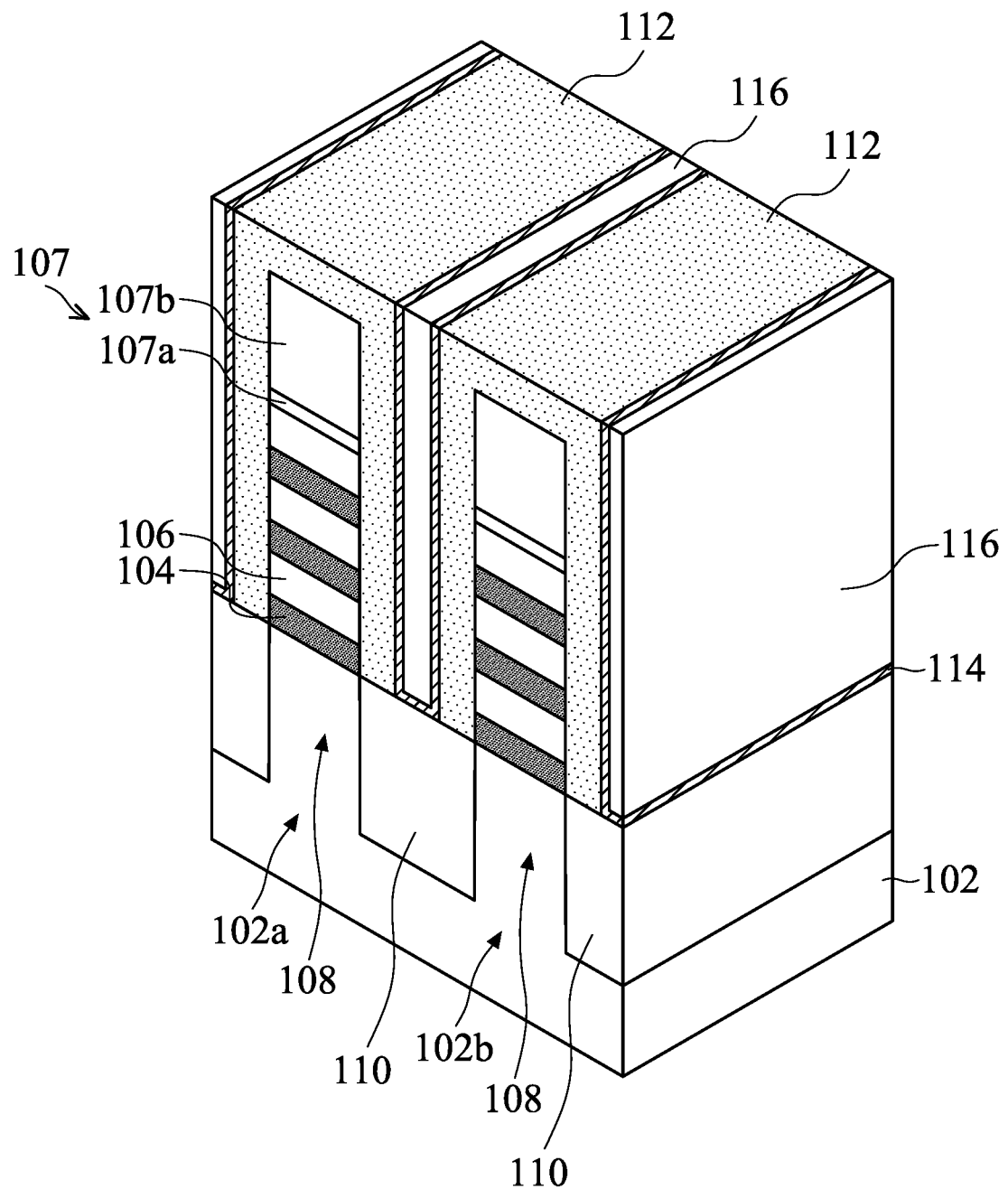

After the semiconductor liner layer is formed, a cladding layer 112 is formed over the top surfaces and the sidewalls of the fin structures 108 and over the isolation structure 110, as shown in FIG. 2B in accordance with some embodiments. The cladding layer 112 may be made of semiconductor materials such as silicon germanium (SiGe). The cladding layer 112 may be formed by performing an epitaxy process, such as VPE and/or UHV CVD, molecular beam epitaxy, other applicable epitaxial growth processes, or combinations thereof. After the cladding layer 112 is deposited, an etching process may be performed to remove the portion of the cladding layer 112 over the top surface of the isolation structure 110. The etching process may include a plasma dry etching process.

Next, a dielectric liner 114 is formed over the cladding layers 112 and the isolation structure 110, as shown in FIG. 2B in accordance with some embodiments. The dielectric liner 114 may be made of SiN, SiCN, SiOCN, SiON, or the like. The dielectric liner 114 may be made of a dielectric material, such as $HfO_2$, $HfSiO_x$ (such as $HfSiO_4$), HfSiON, HfLaO, HfTaO, HfTiO, HfZrO, HfAlOx, $ZrO2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other applicable dielectric material, or combinations thereof. The dielectric liner 114 may be deposited using CVD, PVD, ALD, HDPCVD, MOCVD, RPCVD, PECVD, LPCVD, ALCVD, APCVD, other applicable methods, or combinations thereof.

Next, a fin isolation structure 116 is formed to completely fill the spaces between the adjacent fin structures 108, as shown in FIG. 2B in accordance with some embodiments. The fin isolation structure 116 and the dielectric liner 114 may be made of different dielectric materials. The fin isolation structure 116 may be made of a low k dielectric material such as oxide, nitride, SiN, SiCN, SiOCN, SiON, or the like. The fin isolation structure 116 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, a planarization process is performed until the top surfaces of the cladding layer 112 are exposed, as shown in FIG. 2B in accordance with some embodiments. The planarizing process may include a grinding process, a chemical mechanical polishing (CMP) process, an etching process, other applicable processes, or a combination thereof.

Figure 2C:
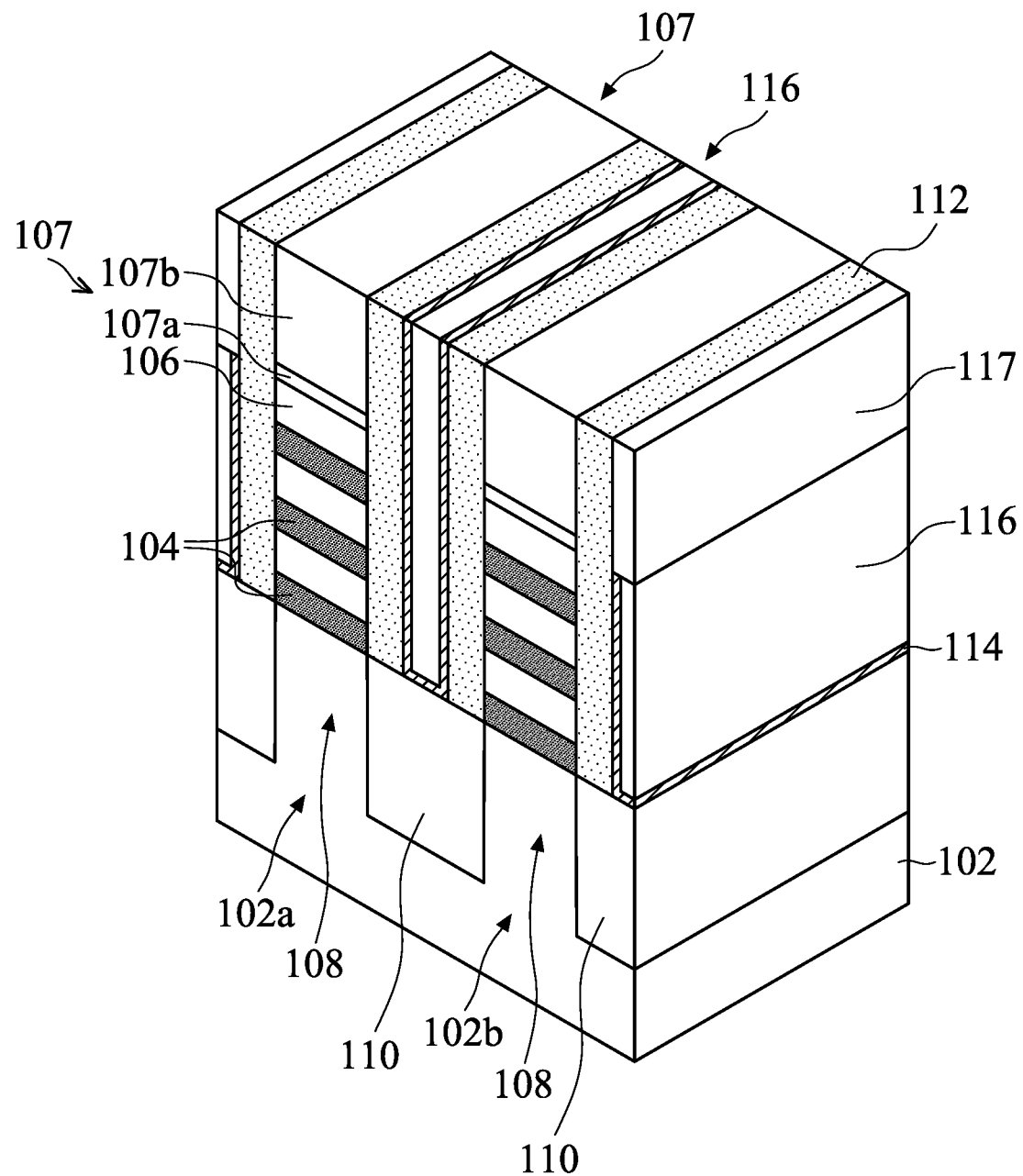

Next, a portion of the fin isolation structure 116 and the dielectric liner 114 are recessed, and a dielectric material is formed in the recesses to form the dielectric structure 117 separating the fin structures 108, as shown in FIG. 2C in accordance with some embodiments. The fin isolation structure 116 may be recessed by a patterning process. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric structure 117 may be made of high-k dielectric material such as $HfO_2$, $ZrO_2$, $HfAlO_x$, $HfSiO_x$, $Al_2O_3$, SiN, SiCN, SiOCN, SiON, other suitable materials, or a combination thereof. In some embodiments, the dielectric constant of the dielectric structure 117 is higher than that of the fin isolation structure 116. The dielectric structure 117 may be formed by performing ALD, CVD, PVD, oxidation-based deposition process, other suitable process, or combinations thereof. After the dielectric structure 117 is formed, a planarization process may be performed until the mask structures 117 are exposed.

Next, the mask structure 107 is removed and the cladding layers 112, the fin isolation structure 116 and the dielectric liner 114 are partially removed to expose the top surfaces of the topmost second semiconductor layers 106 (not shown). The top surfaces of the cladding layers 112 are substantially level with the top surfaces of the topmost second semiconductor layers 106. The mask structures 107 and the cladding layers 112 may be recessed by performing an etching process. The etching processes may be dry etching, wet drying, reactive ion etching, or other applicable etching methods.

Figure 2D:
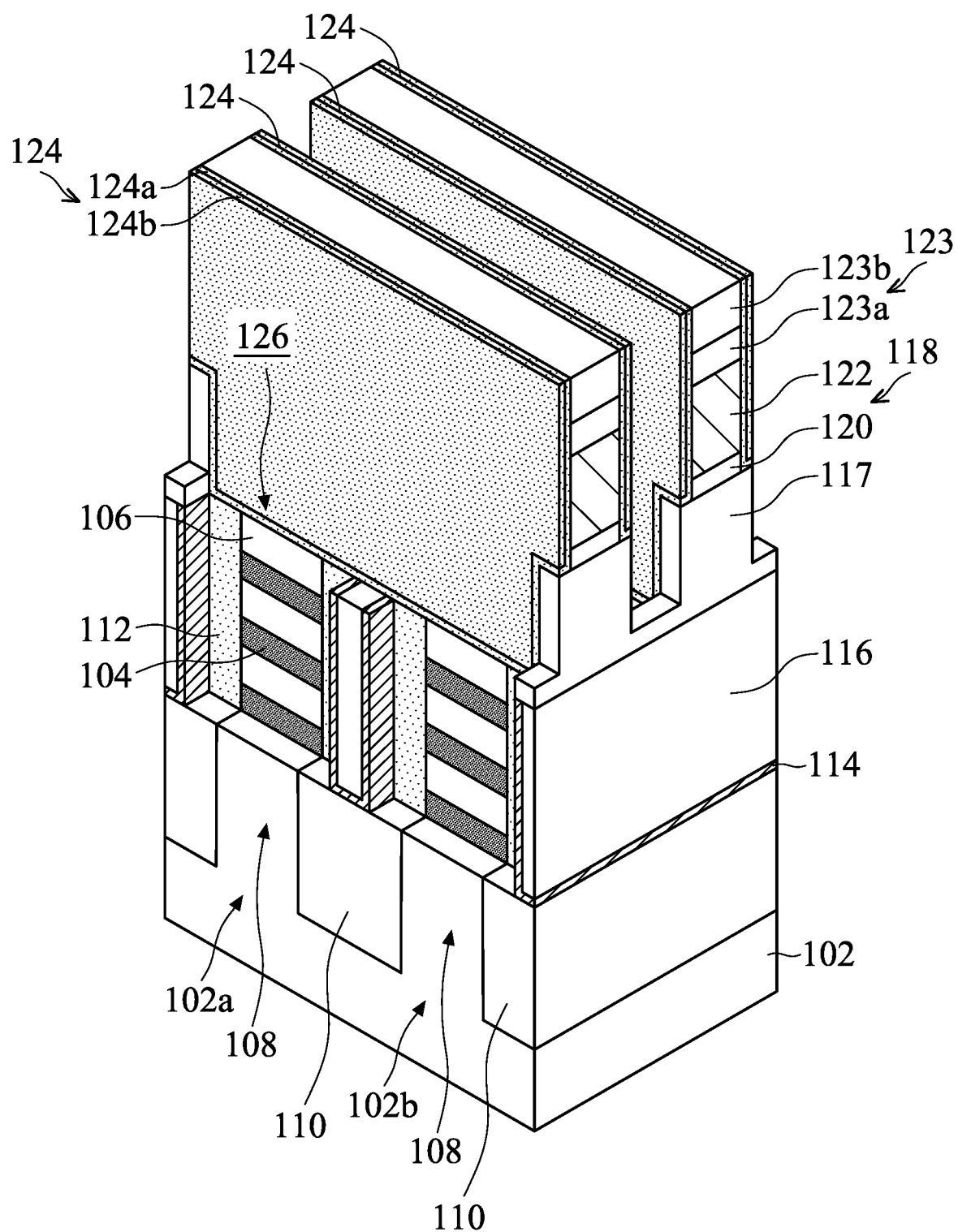

Next, a dummy gate structure 118 is formed over and across the fin structures 108, as shown in FIG. 2D in accordance with some embodiments. The dummy gate structure 118 may include a dummy gate dielectric layer 120 and a dummy gate electrode layer 122. The dummy gate dielectric layer 120 and the dummy gate electrode layer 122 may be replaced by the following steps to form a real gate structure with a high-k dielectric layer and a metal gate electrode layer.

The dummy gate dielectric layer 120 may include silicon oxide. The silicon oxide may be formed by an oxidation process (e.g., a dry oxidation process, or a wet oxidation process), a chemical vapor deposition process, other applicable processes, or a combination thereof. Alternatively, the dummy gate dielectric layer 120 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $(Ba, Sr)TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 122 may include polycrystalline-silicon (poly-Si), poly-crystalline silicon-germanium (poly-SiGe), other applicable materials, or a combination thereof. The dummy gate electrode layer 122 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Hard mask layers 123 are formed over the dummy gate structures 118, as shown in FIG. 2D in accordance with some embodiments. The hard mask layers 123 may include multiple layers, such as an oxide layer 123a and a nitride layer 123b. In some embodiments, the oxide layer 123a is silicon oxide, and the nitride layer 123b is silicon nitride.

Afterwards, an etching process may be performed on the dummy gate dielectric layer 120 and the dummy gate electrode layer 122 to form the dummy gate structure 118 by using the patterned hard mask layers 123 as a mask (not shown). The etching process may be a dry etching process or a wet etching process. The dummy gate dielectric layer 120 and the dummy gate electrode layer 122 may be etched by a dry etching process. After the etching process, the first semiconductor layers 104 and the second semiconductor layers 106 may be exposed on opposite sides of the dummy gate structure 118.

Next, a conformal dielectric layer is formed over the substrate 102 and the dummy gate structure 118, and then an etching process is performed. A pair of spacer layers 124 is formed on opposite sidewalls of the dummy gate structure 118, and a source/drain opening 126 is formed between adjacent dummy gate structures 118, as shown in FIG. 2D in accordance with some embodiments. In some embodiments, the spacer layers 124 are multi-layer structures including the first spacer layers 124a and the second spacer layers 124b. The first spacer layers 124a and the second spacer layers 124b may be made of silicon oxide, silicon nitride, silicon oxynitride, and/or dielectric materials. The first spacer layers 124a and second spacer layers 124b may be formed by different materials with etching selectivity. In some embodiments, the first spacer layers 124a and the second spacer layers 124b are made of silicon nitride with different etching selectivity. The first spacer layers 124a and second spacer layers 124b may be formed by a chemical vapor deposition (CVD) process, a spin-on-glass process, or another applicable process.

The first semiconductor layers 104 and the second semiconductor layers 106 of the fin structure 108 exposed on opposite sides of the dummy gate structure 114 may be removed in the etching process to form the source/drain opening, as shown in FIG. 2D in accordance with some embodiments. The etching process may be a dry etching process or a wet etching process. In some embodiments, the fin structures 108 are etched by a dry etching process.

Next, the first semiconductor layers 104 are laterally etched from the source/drain opening to form recesses (not shown). The outer portions of the first semiconductor layers 104 may be removed, and the inner portions of the first semiconductor layers 104 under the dummy gate structures 118 or the spacer layers 124 may remain. The lateral etching of the first semiconductor layers 104 may be a dry etching process, a wet etching process, or a combination thereof. After the lateral etching process, the sidewalls of the etched first semiconductor layers 104 may be not aligned with the sidewalls of the second semiconductor layers 106. The cladding layer 112 may be exposed in the recess.

Next, an inner spacer (not shown) is formed in the recess. The inner spacer may provide a barrier between subsequently formed source/drain epitaxial structures and gate structure. The inner spacer may be made of silicon oxide, silicon nitride, silicon carbon nitride (SiCN), silicon oxide carbonitride (SiOCN), or a combination thereof. The inner spacer may be formed by a deposition process. The deposition process may include a CVD process (such as LPCVD, PECVD, SACVD, or FCVD), an ALD process, another applicable method, or a combination thereof.

Figure 2E:
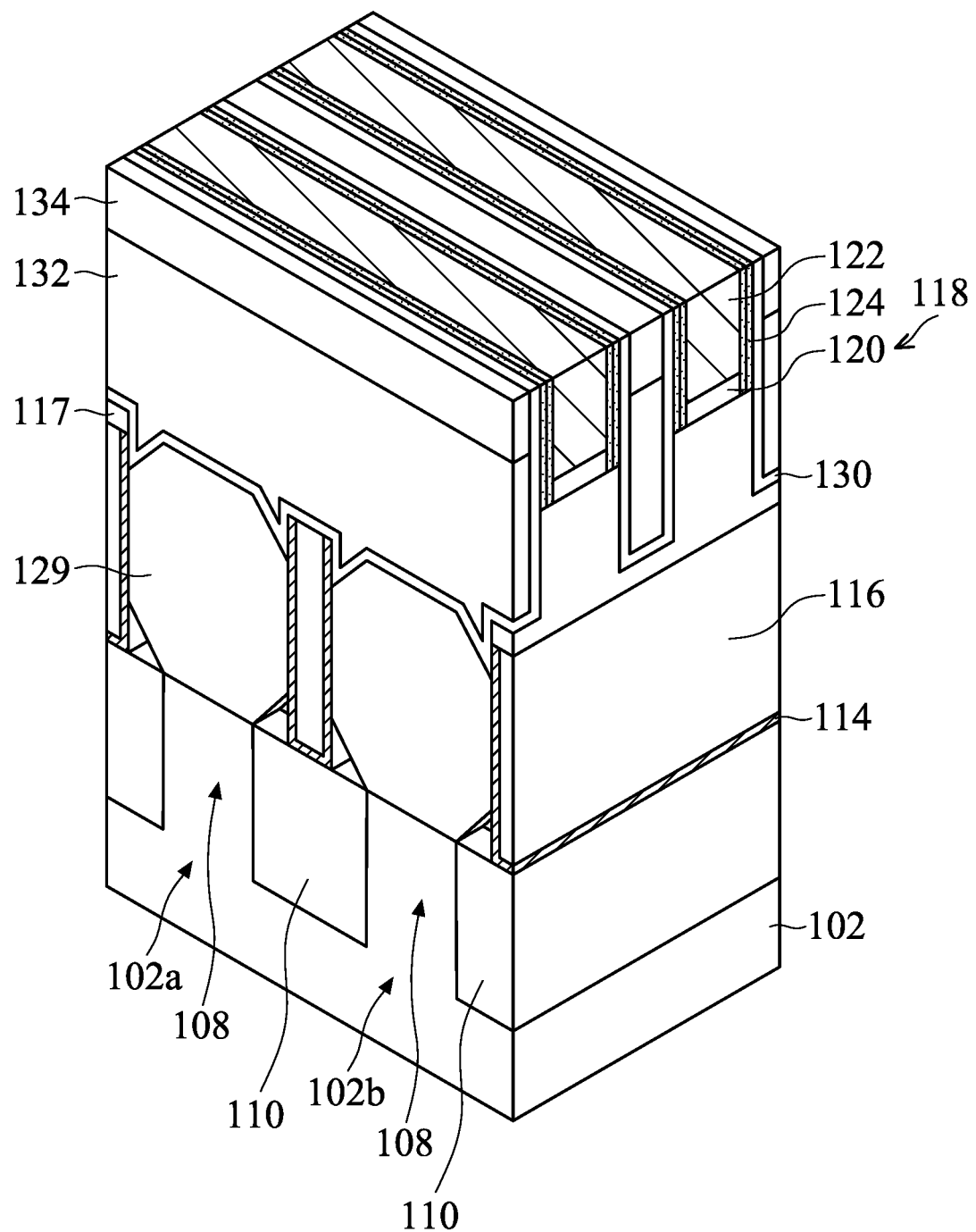

Next, a source/drain epitaxial structure 129 is formed in the source/drain opening, as shown in FIG. 2E in accordance with some embodiments. The source/drain epitaxial structure 129 may be formed over opposite sides of the fin structure 108. A strained material may be grown in the source/drain opening by an epitaxial (epi) process to form the source/drain epitaxial structure 129. In addition, the lattice constant of the strained material may be different from the lattice constant of the substrate 102. The source/drain epitaxial structure 129 may include Ge, SiGe, InAs, InGaAs, InSb, GaAs, GaSb, InAlP, InP, SiC, SiP, other applicable materials, or a combination thereof. The source/drain epitaxial structure 129 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. The source/drain epitaxial structure 129 may be doped with one or more dopants. For example, source/drain epitaxial structure 129 may be silicon germanium (SiGe) doped with boron (B) or another applicable dopant.

Next, an etch stop layer 130 is formed over the source/drain epitaxial structure 129, as shown in FIG. 2E in accordance with some embodiments. The etch stop layer 130 may include silicon nitride, silicon oxide, silicon oxynitride (SiON), other applicable materials, or a combination thereof. The etch stop layer 130 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the source/drain epitaxial structure 129 is formed, an inter-layer dielectric (ILD) structure 132 is formed over the etch stop layer 130, as shown in FIG. 2E in accordance with some embodiments. The ILD structure 132 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bisbenzocyclobutenes (BCB), or polyimide. The ILD structure 132 may be formed by chemical vapor deposition (CVD), spin-on coating, or other applicable processes.

Afterwards, a planarizing process is performed on the ILD structure 132 until the top surface of the dummy gate structure 118 is exposed, as shown in FIG. 2E in accordance with some embodiments. After the planarizing process, the top surface of the dummy gate structure 118 may be substantially level with the top surfaces of the spacer layers 124 and the ILD structure 132. The planarizing process may include a grinding process, a chemical mechanical polishing (CMP) process, an etching process, other applicable processes, or a combination thereof.

Afterwards, a protection layer 134 is formed over the interlayer dielectric layer 132, as shown in FIG. 2E in accordance with some embodiments. More specifically, after the planarization process is performed, the ILD structure 132 is recessed and the protection layer 134 is deposited over the ILD structure 132 to protect the ILD structure 132 from subsequent etching processes. The protection layer 134 may be made of a material that is the same as or similar to that in the contact etch stop layer 130. The protection layer 134 may be made of $Si_3N_4$, SiCN, SiOCN, SiOC, a metal oxide such as $HrO_2$, $ZrO_2$, hafnium aluminum oxide, and hafnium silicate, or other applicable material. The protection layer 134 may be formed by CVD, PVD, ALD, or other applicable methods.

Figures 1, 3A:
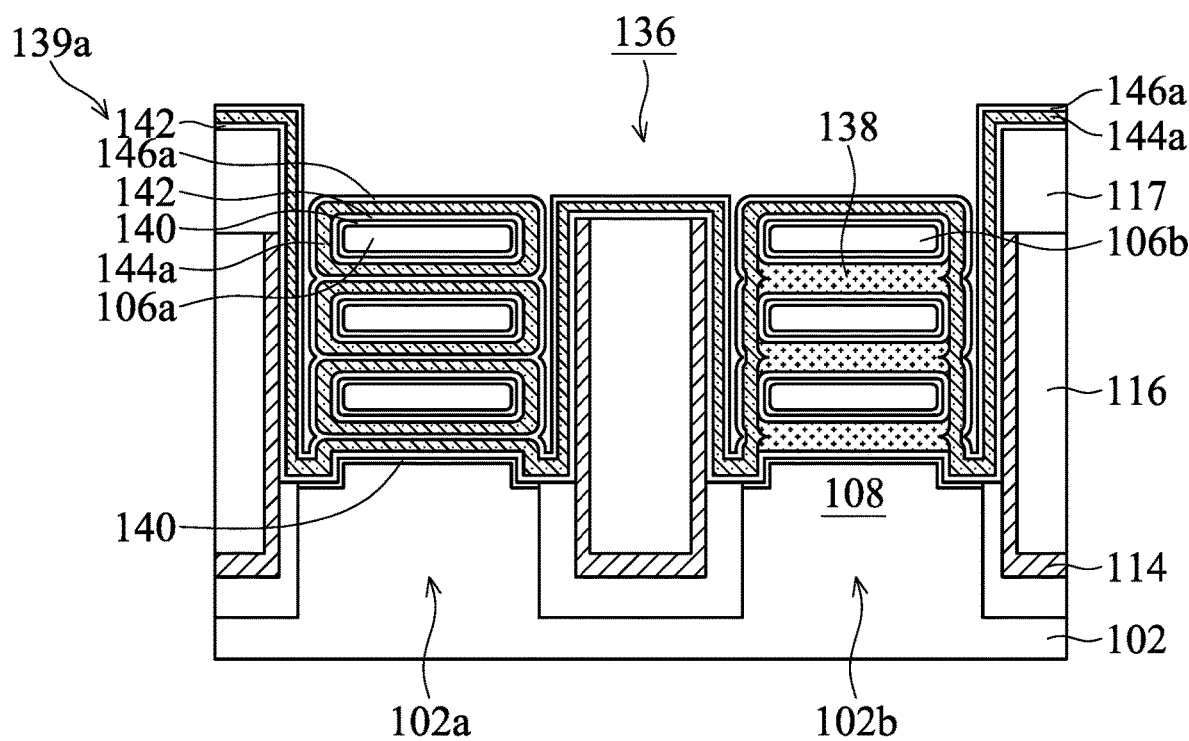
Figures 2, 3A:
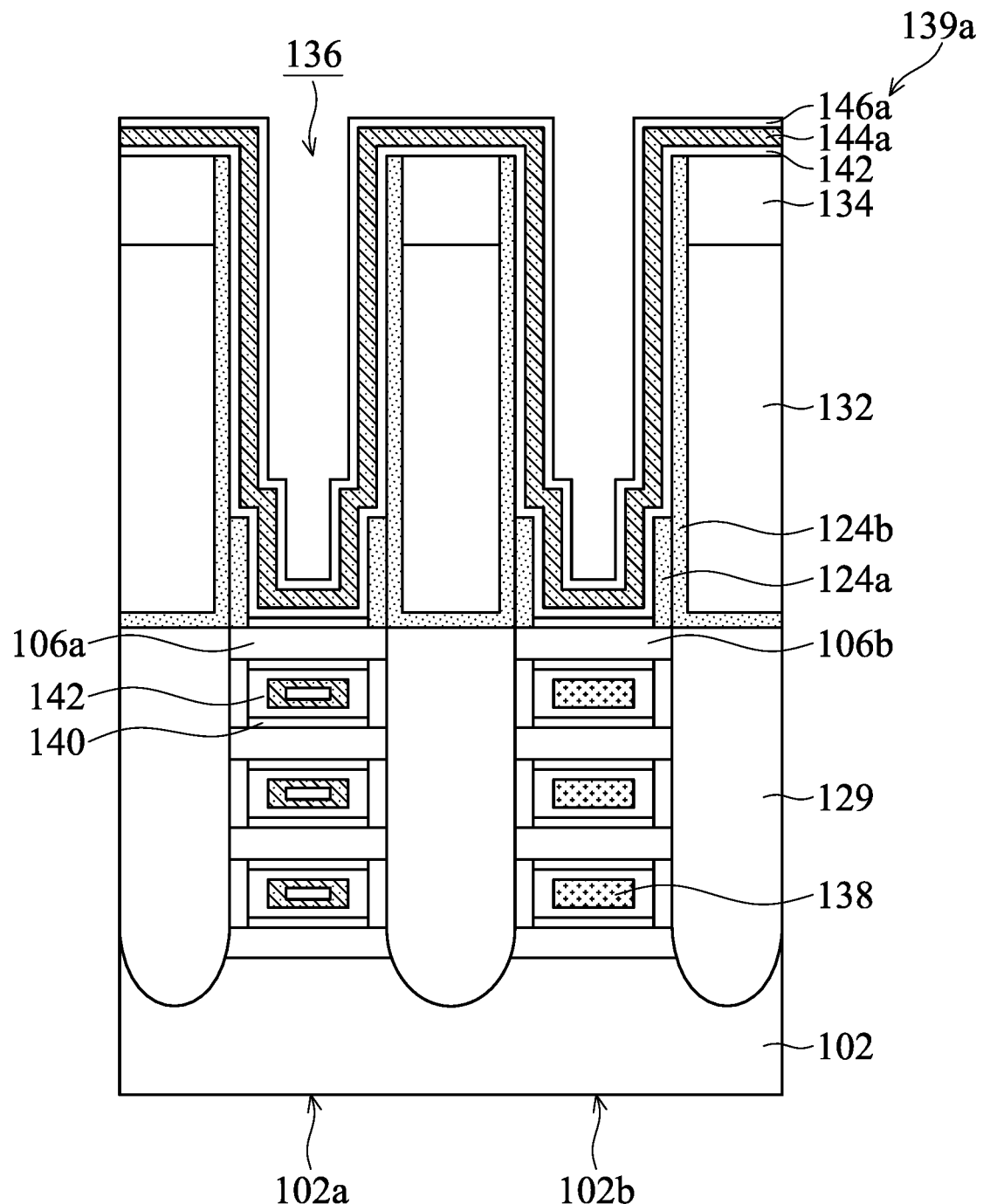

Next, the dummy gate structure 118 and the top portion of the first spacer layer 124a are removed, as shown in FIGS. 3A-1 and 3A-2 in accordance with some embodiments. Therefore, a trench 136 is formed between the spacer layers 124 over the fin structure 108 and the second semiconductor layers 106 are exposed from the trench 136. The bottom portion of the first spacer layers 124a may remain after the removal of the dummy gate structure 118. In some embodiments, the top surfaces of the bottom portion of the first spacer layers 124a are exposed in the trench 136. In some embodiments, the bottom of the trench 136 is narrower than the top of the top of the trench 136. The dummy gate structure 118 and the top portion of the first spacer layer 124a may be removed by a dry etching process or a wet etching process.

Referring to FIG. 1, in step 1010, nanostructures 106a and nanostructures 106b are formed over a substrate 102 in the first region 102a and 102b, respectively. After the trench 136 is formed, the first semiconductor layers 104 are removed to form a gate opening (not shown) between the second semiconductor layers 106. The removal process may include a selective etching process. The selective etching process may remove the first semiconductor layers 104 and remain the second semiconductor layers 106 as nanostructures 106a and 106b of the semiconductor device structure 10a, in accordance with some embodiments. The nanostructures 106a and 106b may be channel regions in the first region 102a and the second region 102b, respectively.

The selective etching process of removing the first semiconductor layers 104 may include a wet etch process, a dry etch process, or a combination thereof. The selective etching process may be a plasma-free dry chemical etching process. The etchant of the dry chemical etching process may include radicals such as HF, $NF_3$, $NH_3$, $H_2$, or a combination thereof.

Referring to FIG. 1, in step 1020, first gate structures 139a are formed surrounding the nanostructures 106a and over the nanostructures 106a in the first region 102a and the nanostructures 106b in the second region 102b. First gate structures 139a are formed surrounding the nanostructure 106a, as shown in FIGS. 3A-1 and 3A-2 in accordance with some embodiments. Therefore, the gate control ability may be enhanced. As shown in FIGS. 3A-1 and 3A-2, the first gate structures 139a are multi-layered structures. Each of the first gate structures 139a may include an interfacial layer 140, a high-k dielectric layer 142, a first metal gate layer 144a, a first glue layer 146a, and a first gate electrode layer (not shown). The nanostructures 106a may be surrounded and in direct contact with the interfacial layers 140, and the interfacial layers 140 may be surrounded by the high-k dielectric layers 142.

The interfacial layers 140 may be made of silicon oxide, and the interfacial layers may be formed by thermal oxidation. The high-k dielectric layer 142 may include dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. The high-k dielectric layers 142 may be formed by using CVD, ALD, other applicable methods, or a combination thereof.

A filling structure 138 is formed between the nanostructures 106b in the second region 102b, as shown in FIGS. 3A-1 and 3A-2 in accordance with some embodiments. By forming the filling structure 138 between the nanostructures 106b, the subsequently formed metal gate layer may not be formed between the nanostructures 106b in the second region 102b, and it may be easier to remove the filling structure 138 than to remove the metal gate layer between the nanostructures 106b. The filling structure 138 may include metal oxides. The filling structure 138 may be formed by filling the filling structure material 138 in the second region 102b, and the filling structure material 138 between the nanostructures 106b and the fin isolation structure 116 is removed. The filling structure 138 may be formed by a patterning process. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

The filling structure 138 may be formed by using CVD, ALD, other applicable methods, or a combination thereof.

The first metal gate layer 144a is conformally formed surrounding the nanostructures 106a and over the nanostructures 106a and 106b, as shown in FIGS. 3A-1 and 3A-2 in accordance with some embodiments. The first metal gate layer 144a may be made of metal materials. In some embodiments, the metal materials of the first metal gate layer 144a include N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The first metal gate layer 144a may be formed by using CVD, ALD, other applicable methods, or a combination thereof.

Next, a first glue layer 146a is conformally formed over the first metal gate layer 144a and surrounds the first metal gate layer 144a, as shown in FIGS. 3A-1 and 3A-2 in accordance with some embodiments. The first glue layer 146a may provide adhesion between the first metal gate layer 144a and the overlying layers. In some embodiments, the first glue layer 146a is conformally formed surrounding the nanostructures 106a and over the nanostructures 106a and 106b. The material of the first glue layer 146a may be TiN, Ti, other applicable materials, or a combination thereof. The first glue layer 146a may be conformally formed over the first metal gate layer 144a by a physical vapor deposition process (PVD) (e.g., evaporation or sputtering), an atomic layer deposition process (ALD), an electroplating process, other applicable processes, or a combination thereof.

Figures 1, 3B:
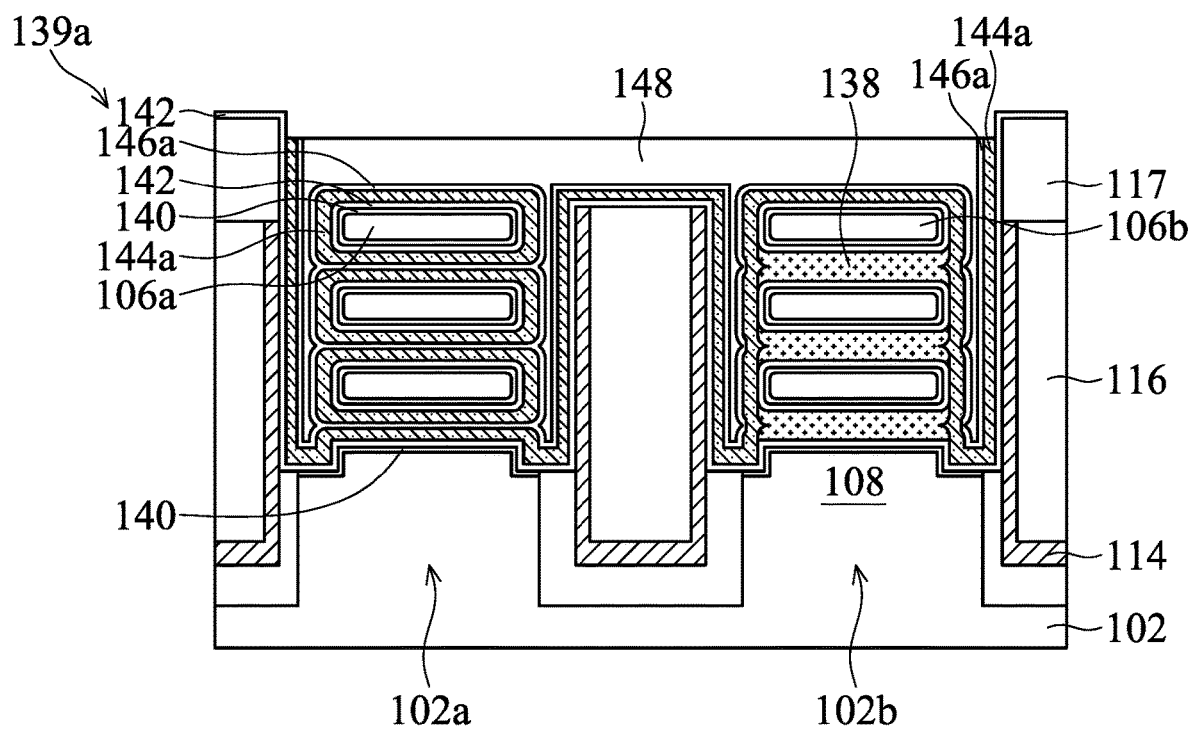
Figures 2, 3B:
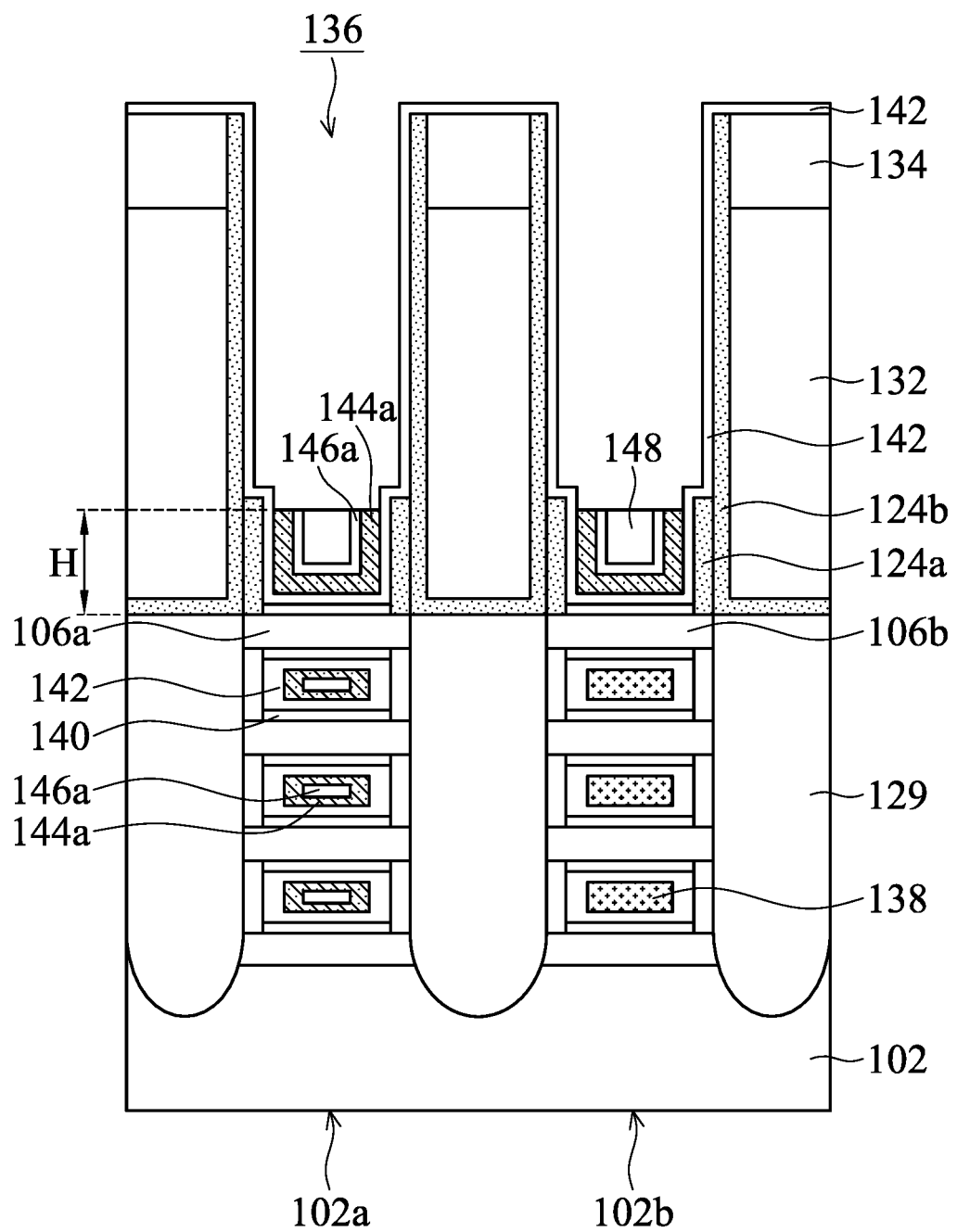

Referring to FIG. 1, in step 1030, the first metal gate layer 144a over the nanostructures 106a and 106b are etched back. Next, a coating layer 148 is formed over the first metal gate layer 144a in the first region 102a and the second region 102b. The coating layer 148 may include anti-reflective materials such as a bottom anti-reflective coating (BARC) layer. The coating layer 148 may be etched back to a height H, as shown in FIGS. 3B-1 and 3B-2 in accordance with some embodiments. Later, the first metal gate layer 144a and the first glue layer 146a are also etched back to the height H, and the top portion of the first metal gate layer 144a and the first glue layer 146a are removed, as shown in FIG. 3B-2 in accordance with some embodiments. In some embodiments, the top surface of the coating layer 148 is substantially level with the top surfaces of the first metal gate layer 144a and the first glue layer 146a. The coating layer 148, the first metal gate layer 144a and the first glue layer 146a may be etched back by an ashing process.

In some embodiments, the first metal gate layer 144a has a height H in a range of about 14 nm to about 18 nm. If the height H is too low, the etching back process may damage the nanostructures 106a and 106b if a seam is formed in the following process. If the height H is too high, the subsequently metal gate etching back process may suffer loading effect. The metal gate and the source/drain region may also be short-circuit.

In some embodiments, the top surface of the first metal gate layer 144a is lower than the top surface of the first spacer layers 124a. In some embodiments, the top surface of the first metal gate layer 144a is substantially level with the top surface of the first glue layer 146a.

Figures 1, 3C:
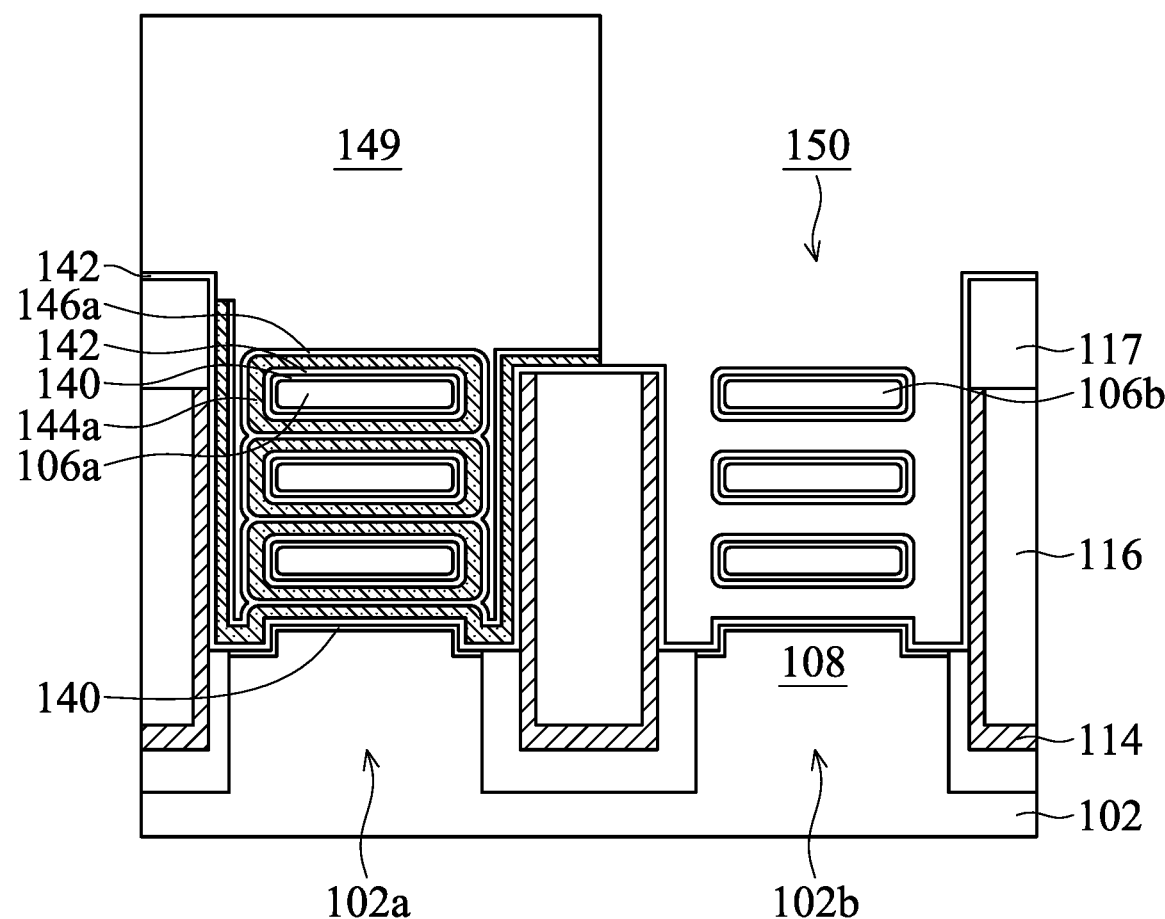
Figures 2, 3C:
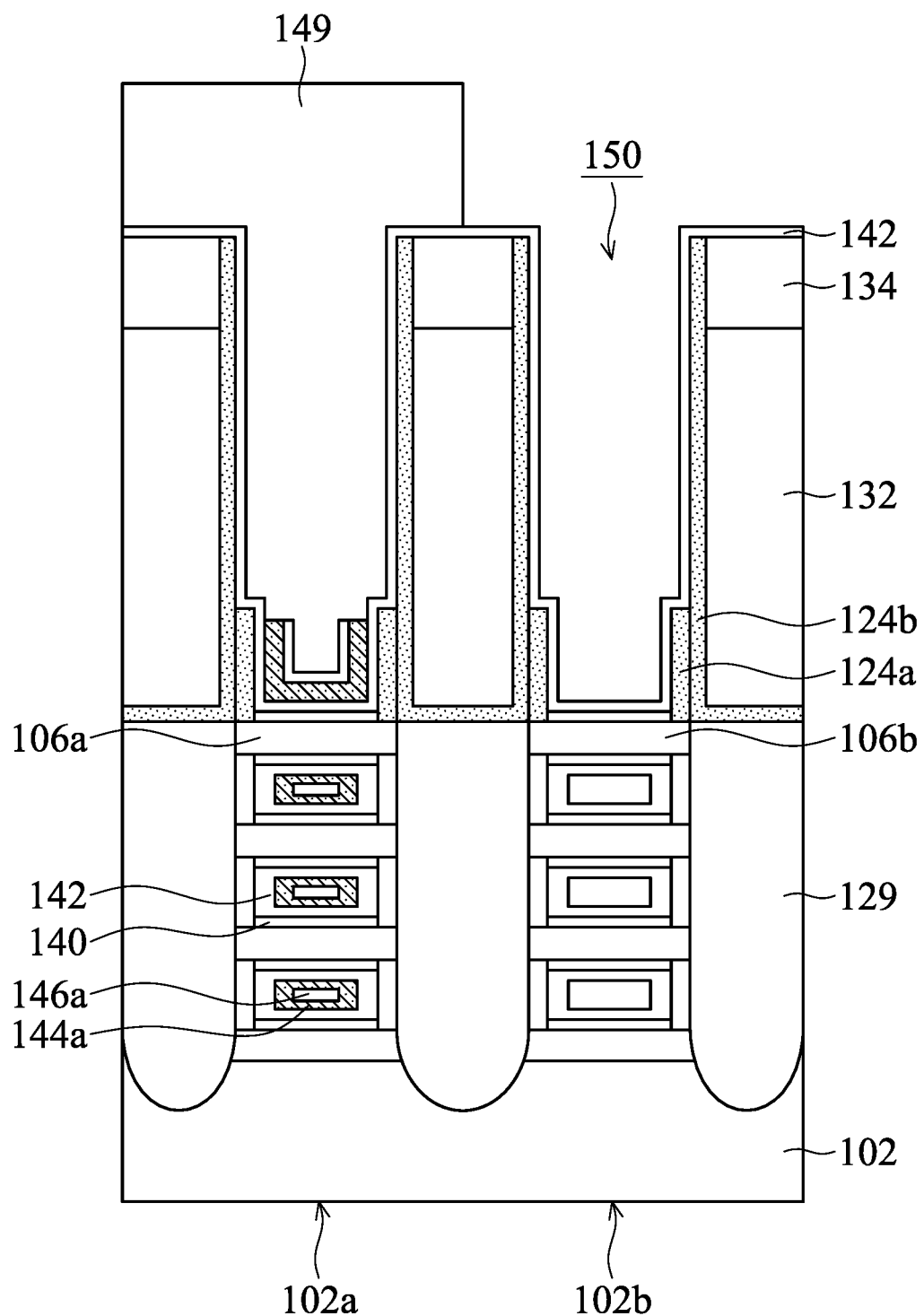

Referring to FIG. 1, in step 1040, the first metal gate layer 144a over the nanostructures 106b in the second region 102b is removed. The coating layer 148 in both the first region 102a and the second region 102b may be removed first, and the first metal gate layer 144a, the first glue layer 146a, and the filling structure 138 in the second region 102b may be removed later, as shown in FIGS. 3C-1 and 3C-2 in accordance with some embodiments.

The coating layer 148 may be removed by a dry etching process. The first metal gate layer 144a, the first glue layer 146a, and the filling structure 138 may be removed by a patterning process. The patterning process may include forming a patterned mask layer 149 a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a wet etching process using etchant such as ammonia. After the first metal gate layer 144a, the first glue layer 146a, and the filling structure 138 in the second region 102b are removed, a gate opening 150 is formed between the nanostructures 106b in the second region 102b.

Figures 1, 3D:
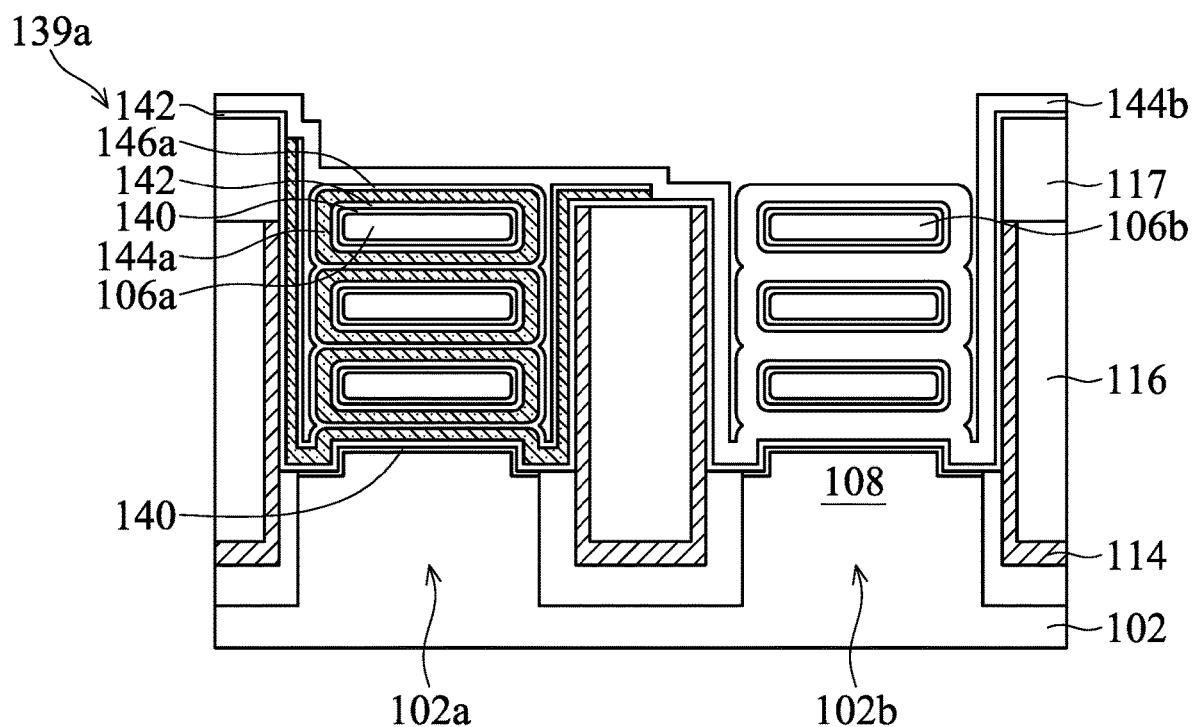
Figures 2, 3D:
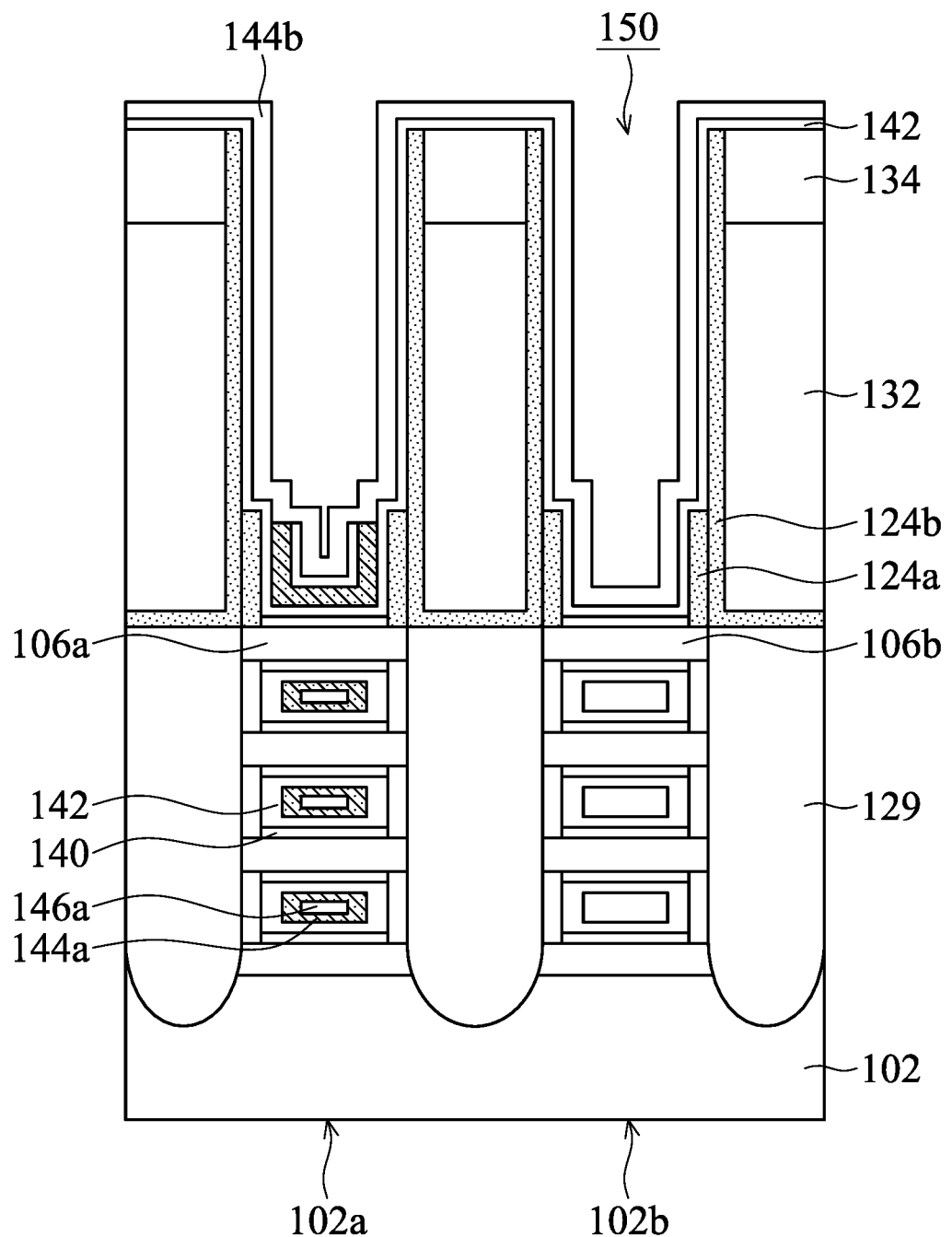

Next, referring to FIG. 1, in step 1050, a second metal gate layer 144b is formed surrounding the nanostructures 106b and over the nanostructures 106a and 106b. The second metal gate layer 144b is conformally formed over the nanostructures 106a and 106b, as shown in FIGS. 3D-1 and 3D-2 in accordance with some embodiments. In some embodiments, the second metal gate layer 144b is in contact with the top surface of the first metal gate layer 144a in the first region 102a. In some embodiments, the top surface of the second metal gate layer 144b is higher than the top surface of the first metal gate layer 144a. In some embodiments, the second metal gate layer 144b is directly above the first spacer layers 124a. In some embodiments, the first metal gate layer 144a is narrower than the second metal gate layer 144b over the nanostructures 106a since the first metal gate layer 144a is only formed between the first spacer layers 124a.

The second metal gate layer 144b may be made of metal materials. In some embodiments, the second metal gate layer 144b includes P-work-function metal. The P-work-function metal may include titanium nitride (TiN), tungsten nitride (WN), tantalum nitride (TaN), ruthenium (Ru) or a combination thereof. The second metal gate layer 144b may be formed by using CVD, ALD, other applicable methods, or a combination thereof.

Figures 1, 3E:
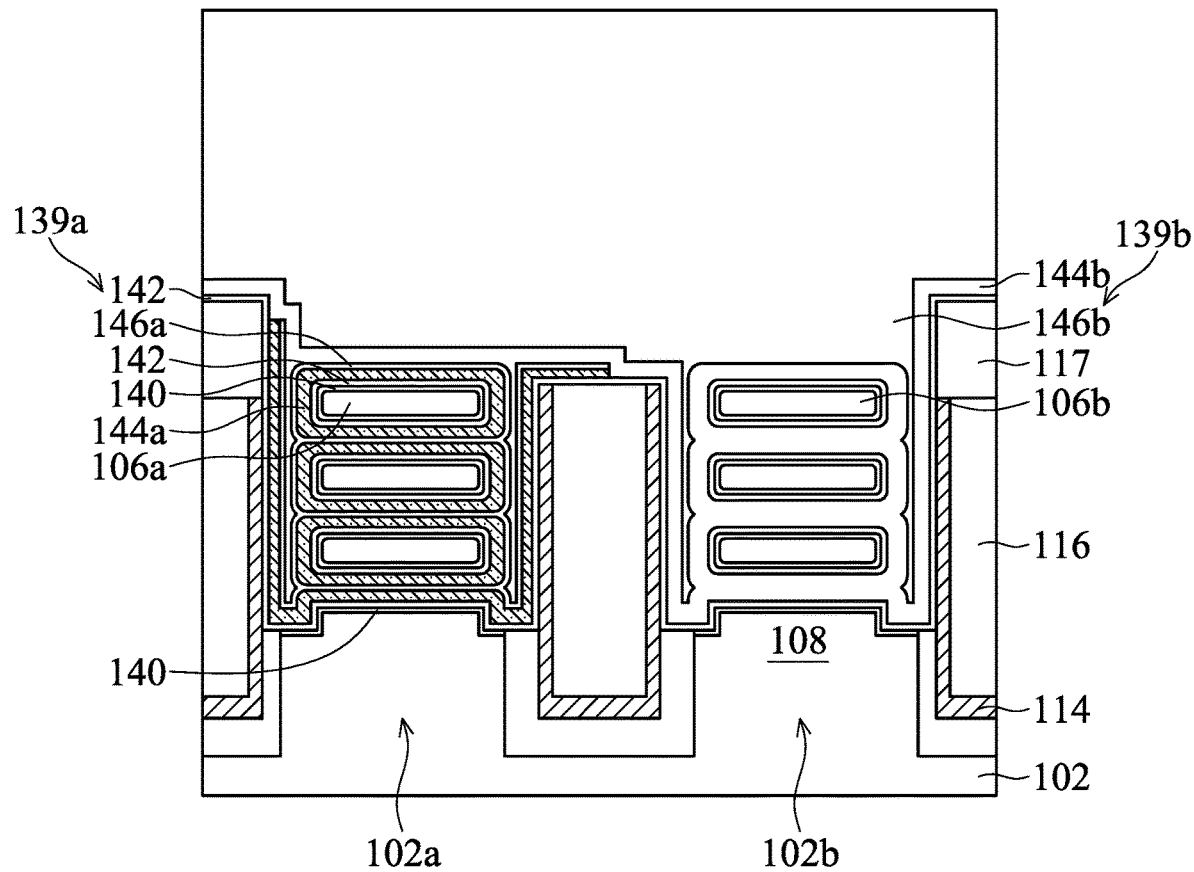
Figures 2, 3E:
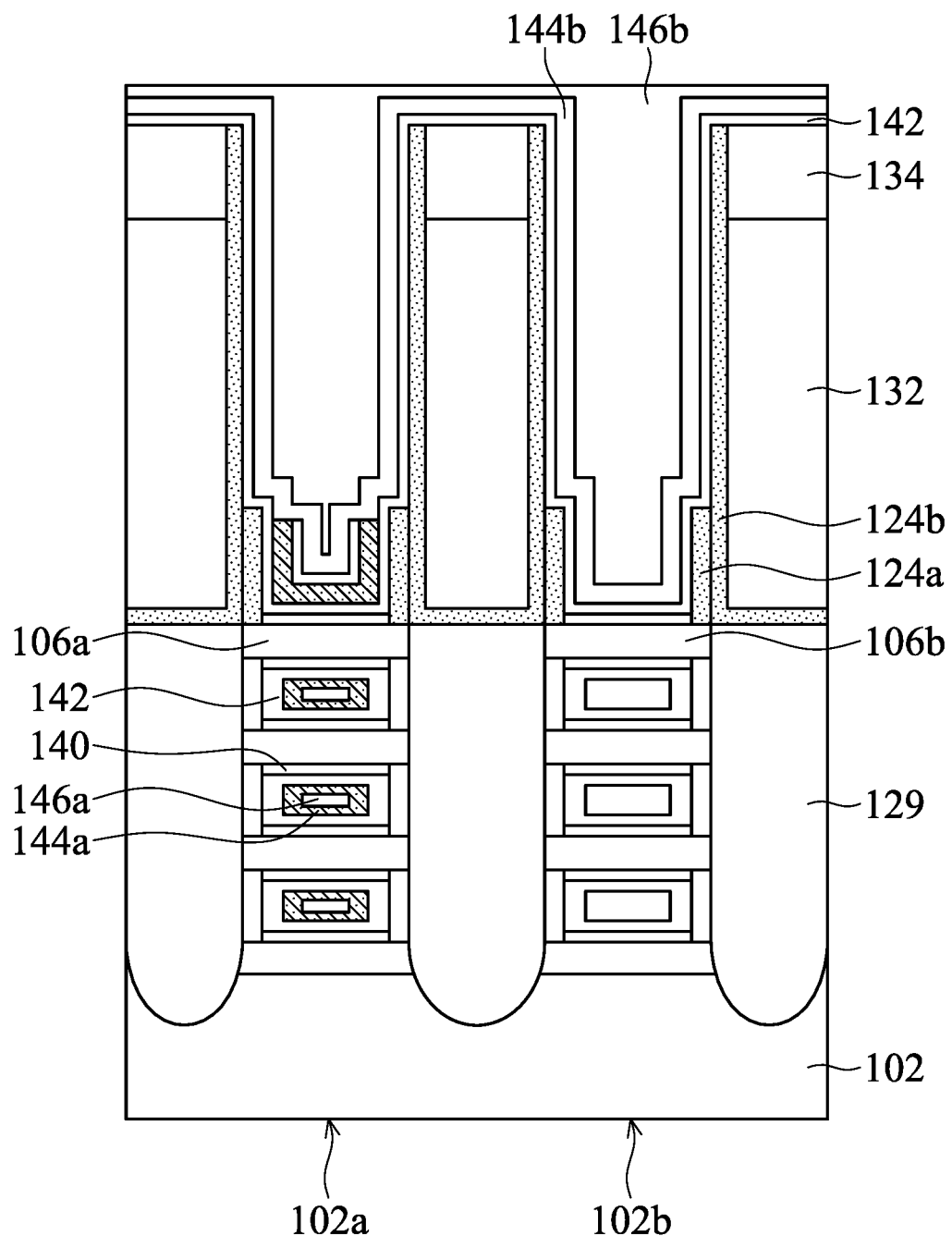

Afterwards, a second glue layer 146b is formed over the second metal gate layer 144b filling the gate opening 150, as shown in FIGS. 3E-1 and 3E-2 in accordance with some embodiments. The second glue layer 146b may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the second glue layer 146b. Later, a planarization process or an etch back process is performed to remove excess conductive materials. In some embodiments, the top surface of the second glue layer 146b is substantially level with the top surface of the second metal gate layer 144b and top surface of the ILD structure 132 after the planarization process.

The second gate structure 139b is formed surrounding the nanostructure 106b in the second region 102b, as shown in FIGS. 3E-1 and 3E-2 in accordance with some embodiments. As shown in FIGS. 3E-1 and 3E-2, the second gate structure 139b are multi-layered structures. Each of the second gate structures 139b may include an interfacial layer 140, a high-k dielectric layer 142, a second metal gate layer 144b, a second glue layer 146b, and a gate electrode layer (not shown).

Figures 1, 3F:
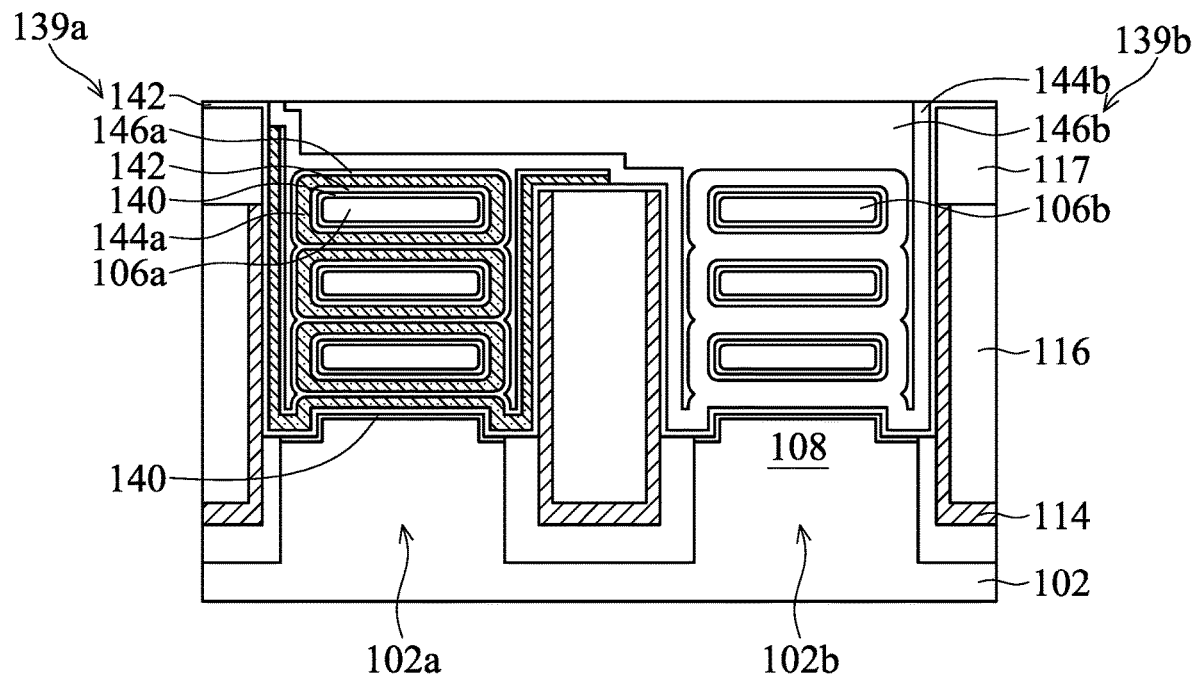
Figures 2, 3F:
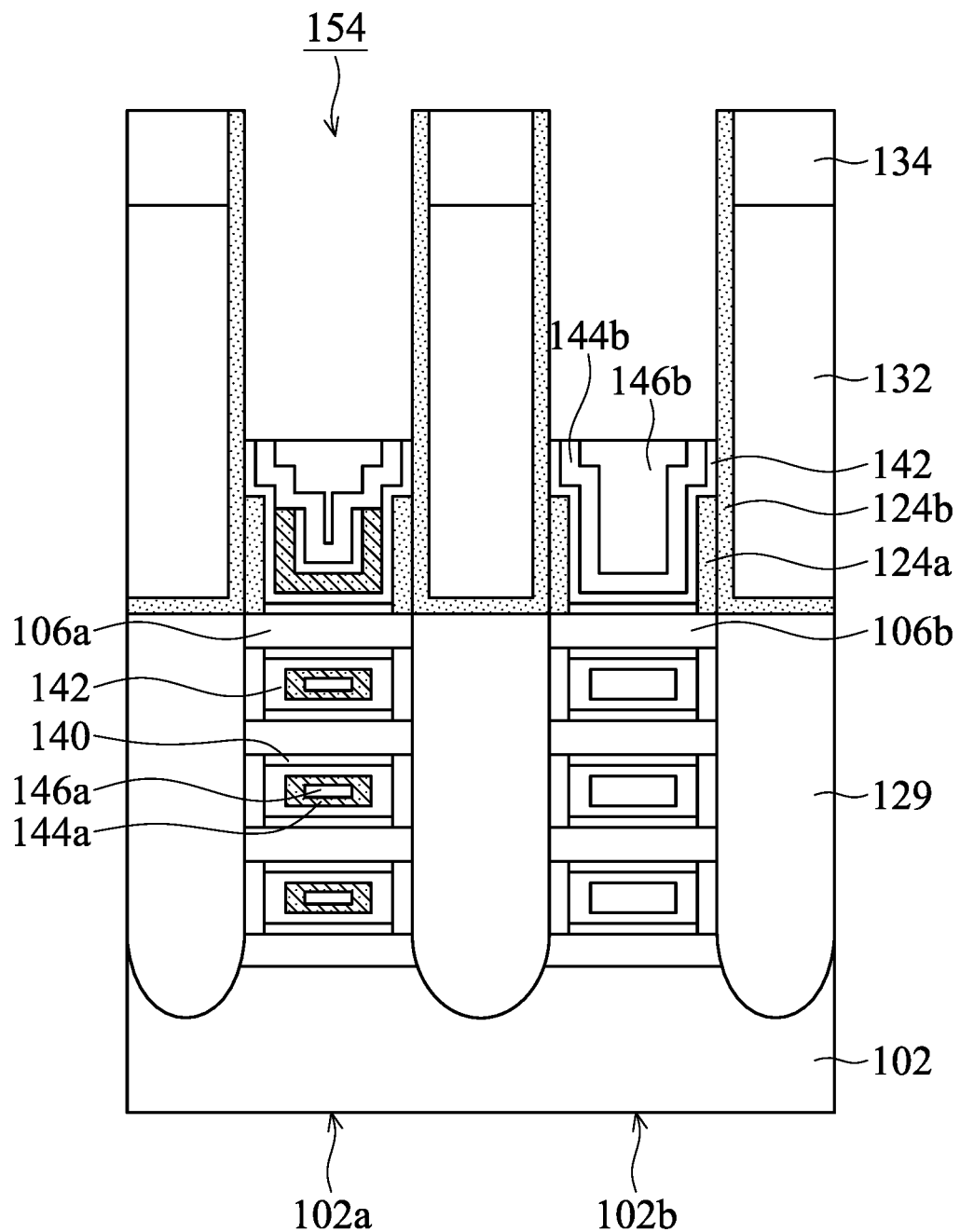

Next, the second metal gate layer 144b and the second glue layer 146b are etched back, and a recess 154 is formed over the second metal gate layer 144b, as shown in FIGS. 3F-1 and 3F-2 in accordance with some embodiments. Since the first metal gate layer 144a is etched back in FIGS. 3B-1 and 3B-2, the first metal gate layer 144a is not etched during etching back the second metal gate layer 144b and the second glue layer 146b. Therefore, the loading effect of etching the first metal gate layer 144a and the second metal gate layer 144b may be prevented. In some embodiments, the first metal gate layer 144a is covered by the second metal gate layer 144b after etching back the second metal gate layer 144b.

Figures 1, 3G:
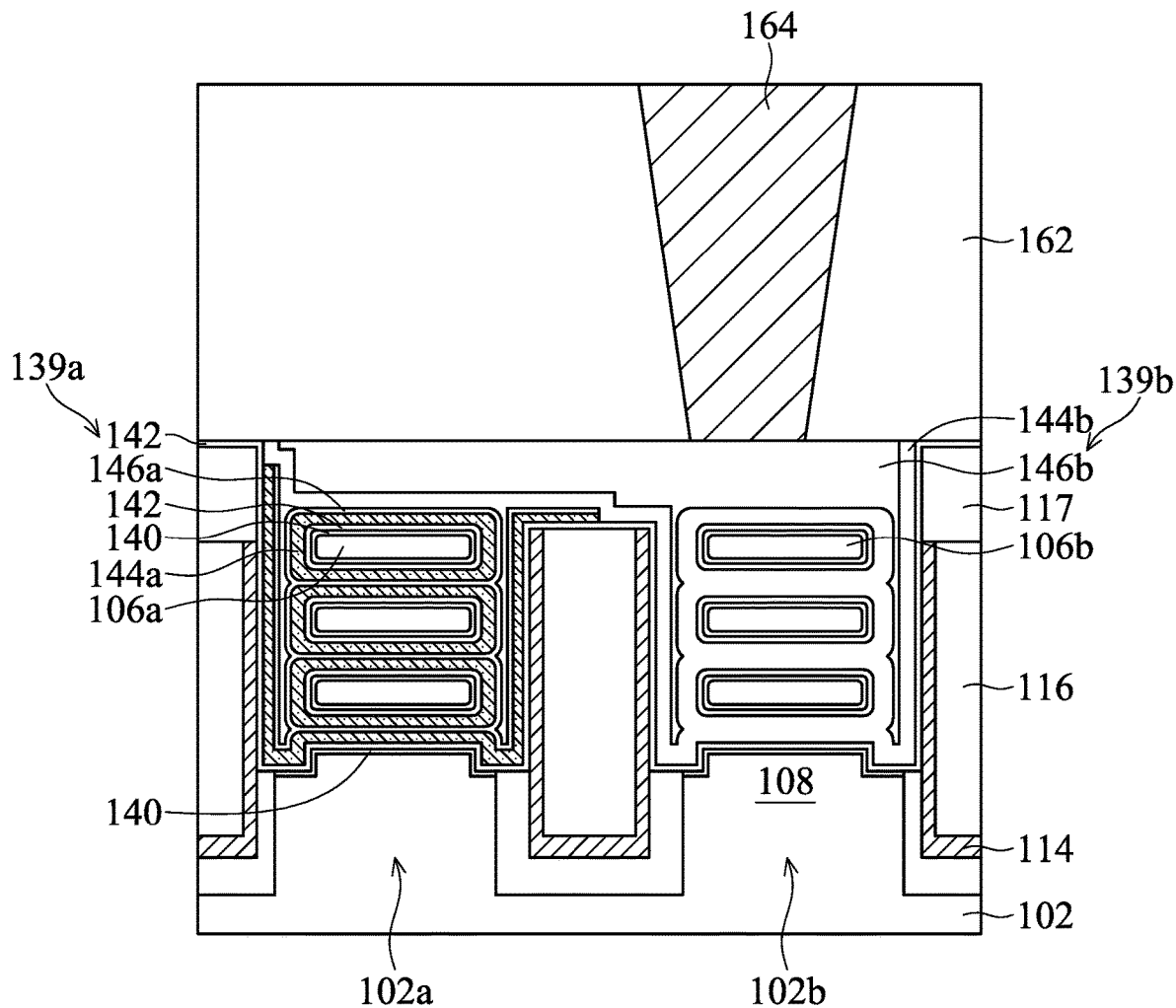
Figures 2, 3G:
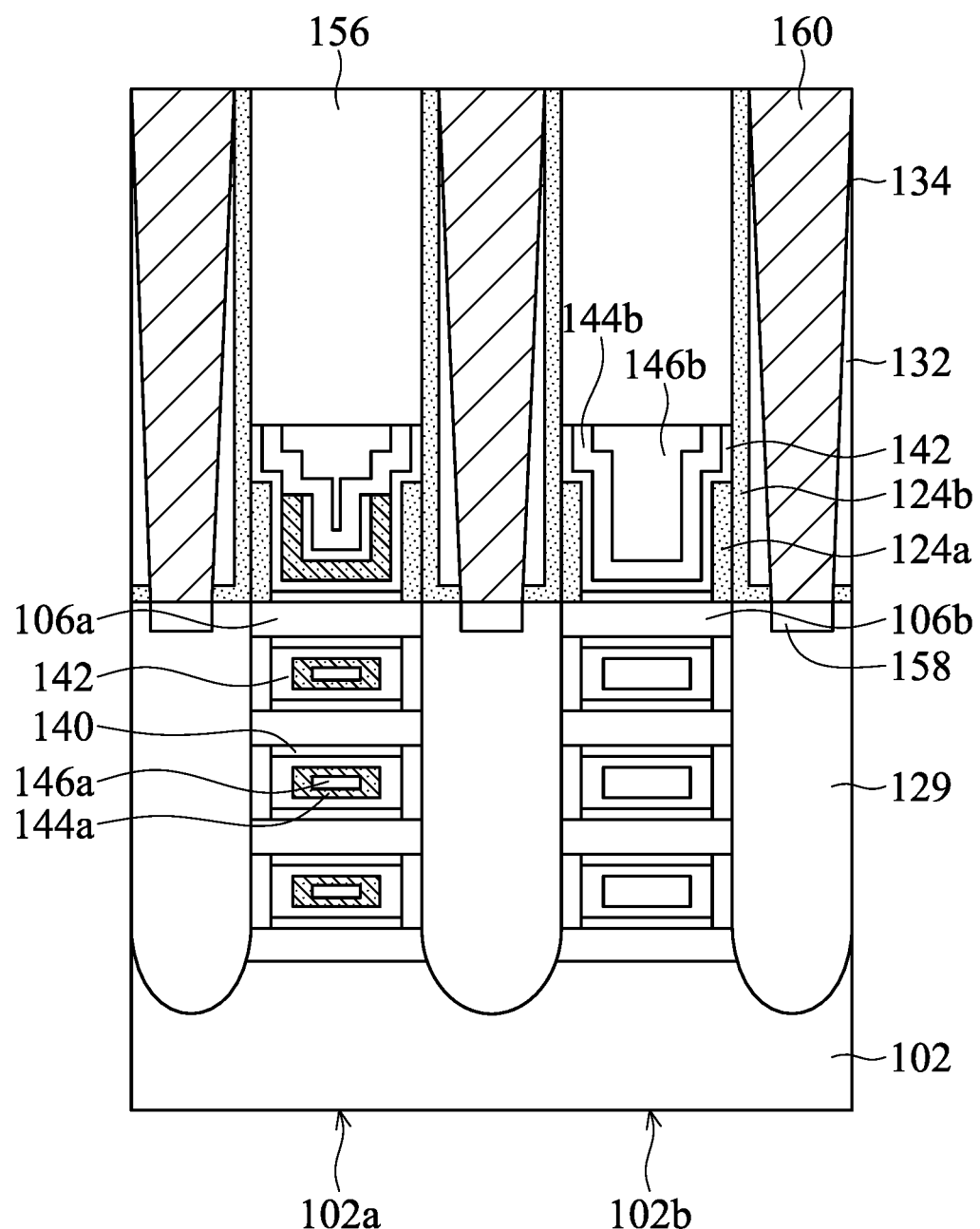

Later, a gate electrode layer 153 is formed over the second metal gate layer 144b and the second glue layer 146b, as shown in FIG. 3G-1 in accordance with some embodiments. The gate electrode layer 153 may be made of one or more layers of conductive material, such as tungsten, TiN, polysilicon, aluminum, copper, titanium, tantalum, cobalt, molybdenum, tantalum nitride, nickel silicide, cobalt silicide, WN, TiAl, TiAlN, TaCN, TaC, TaSiN, metal alloys, another applicable material, or a combination thereof. The gate electrode layer 153 may be formed by using CVD, ALD, electroplating, another applicable method, or a combination thereof.

Next, a cap layer 156 is formed in the recess 154 above the gate structure 108, as shown in FIG. 3G-2 in accordance with some embodiments. In some embodiments, the cap layer 156 is formed over the second metal gate layer 144b between the second spacer layers 124b. The cap layer 156 may provide isolation for subsequently formed contact structure and conductive elements nearby. The cap layer 156 may be made of dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The cap layer 156 may be deposited in the recess 154 by CVD (such as HDP-CVD, PECVD, or HARP), ALD, another suitable method, and/or a combination thereof. After the cap layer 156 is deposited, a planarization process (e.g., a chemical mechanical polishing process or an etching back process) may optionally be performed to remove excess dielectric materials.

Next, a source/drain opening is formed in the ILD structure 132 and the protection layer 134, and a metal semiconductor compound layer 158 may be formed over the source/drain epitaxial structure 129, as shown in FIG. 3G-2 in accordance with some embodiments. The metal semiconductor compound layer 158 may reduce the contact resistance between the source/drain epitaxial structure 129 and the subsequently formed source/drain contact structure over the source/drain epitaxial structure 129. The metal semiconductor compound layer 158 may be made of titanium silicide (TiSi$_2$), nickel silicide (NiSi), cobalt silicide (CoSi), or other suitable low-resistance materials. The metal semiconductor compound layer 158 may be formed over the source/drain epitaxial structure 129 by forming a metal layer over the source/drain epitaxial structure 129 first. The metal layer may react with the source/drain epitaxial structure 129 in an annealing process and a metal semiconductor compound layer 158 may be produced. Afterwards, the unreacted metal layer may be removed in an etching process and the metal semiconductor compound layer 158 may be left.

Next, a barrier layer (not shown) may be conformally formed over the bottom surface and the sidewalls of the source/drain opening. Afterwards, the barrier layer may be etched back. The barrier layer remains over the bottom surface of the source/drain opening. The barrier layer may be formed before filling the conductive material in the source/drain opening to prevent the conductive material from diffusing out. The barrier layer may also serve as an adhesive or glue layer. The material of the barrier layer may be TiN, Ti, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Afterwards, a source/drain contact structure 160 is formed into the source/drain opening over the source/drain epitaxial structure 129, as shown in FIG. 3G-2 in accordance with some embodiments. The source/drain contact structure 160 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The source/drain contact structure 160 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the source/drain contact structure 160, and then a planarization process such as a chemical mechanical polishing (CMP) process or an etch back process is optionally performed to remove excess conductive materials. After the planarization process, the top surface of the source/drain contact structure 160 may be level with the top surface of the second spacer layers 124b.

Next, a dielectric layer 162 is formed over the gate structures 140, as shown in FIG. 3G-1 in accordance with some embodiments. The dielectric layer 162 may include multilayers made of multiple dielectric materials, such as Al$_2$O$_3$, ZrO$_2$, silicon oxide, silicon nitride, silicon oxynitride, phosphosilicate glass (PSG), borophosphosilicate glass (BPSG), or other applicable dielectric materials. The dielectric layer 162 may be formed by chemical vapor deposition (CVD), physical vapor deposition, (PVD), atomic layer deposition (ALD), or other applicable processes.

After the dielectric layer 162 is formed, a conductive structure 164 is formed through the dielectric layer 162 and lands on the gate electrode layer 153, as shown in FIG. 3G-1 in accordance with some embodiments. The processes and materials for forming the conductive structure 164 may be the same as, or similar to, those used to form the source/drain contact structure 160. For the purpose of brevity, the descriptions of these processes and materials are not repeated herein. In some embodiments, the conductive structure 164 and the source/drain contact structure 160 are made of the same conductive material.

With etching back the first metal gate layer 144a before forming the second metal gate layer 144b, only the second metal gate layer 144b is etched back when forming the cap layer 156. Therefore, it may be easier to control the gate height and avoid over-etching the first metal gate layer 144a and the second metal gate layer 144b. The loading effect between different regions 102a and 102b may be reduced, and the yield may be improved.

Many variations and/or modifications may be made to the embodiments of the disclosure. FIGS. 4A-1, 4A-2, 4B-1, 4B-2, 4C-1, 4C-2 are cross-sectional representations of various stages of forming a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A-2 in accordance with some embodiments, a seam 164 is formed in the second glue layer 146b.

Since the gate opening 150 is narrow, it may be difficult to form the second glue layer 164b in the gate opening 150. There may be a seam 164 formed in the second glue layer 164b. The seam 164 may cause punch though when etching back the second metal gate layer 144b. However, since the first metal gate layer 144a is etched back before forming the second metal gate layer 144b, etching back the second metal gate layer 144b may be well controlled, and the seam 164 may not cause punch through when etching back the second metal gate layer 144b.

Figures 1, 4A:
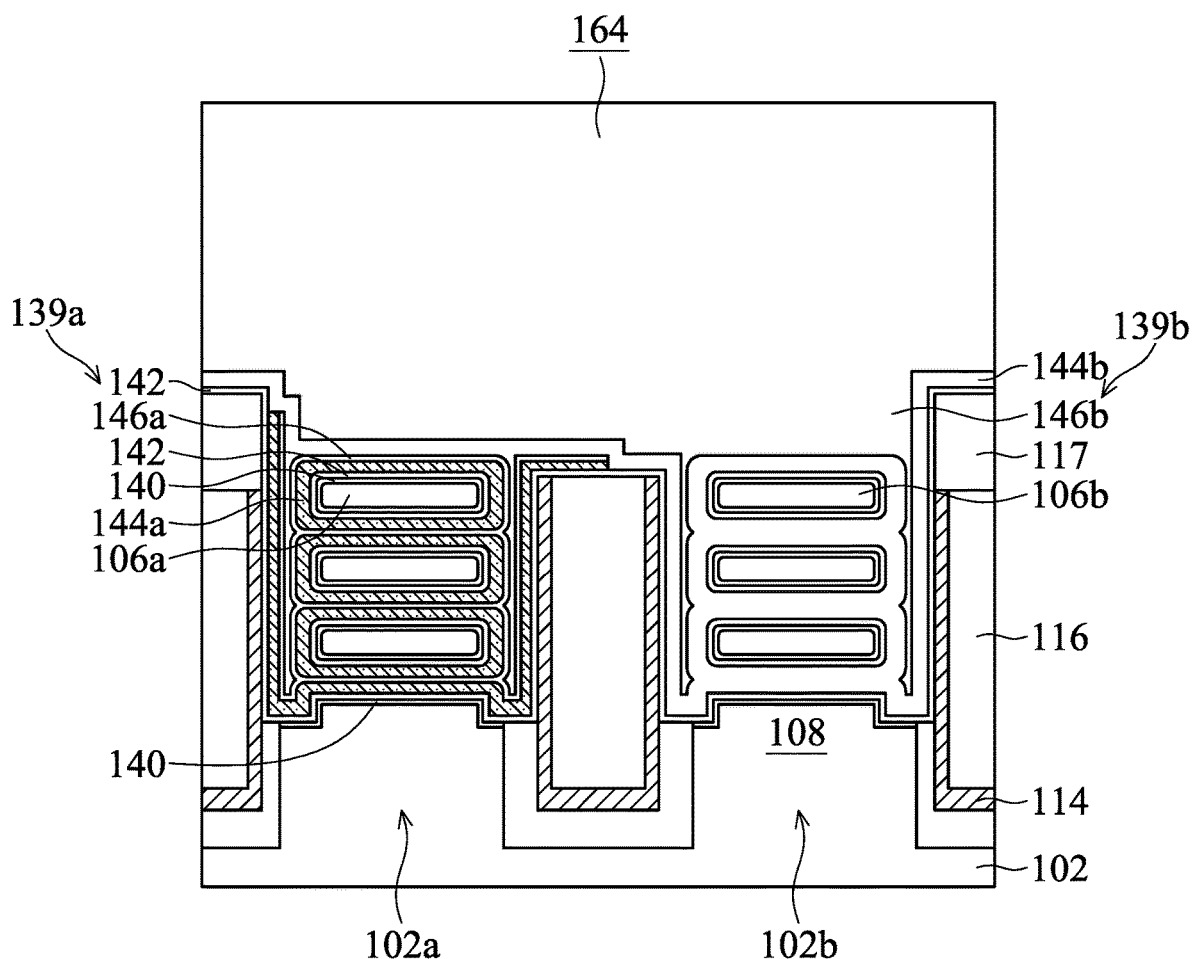
Figures 2, 4A:
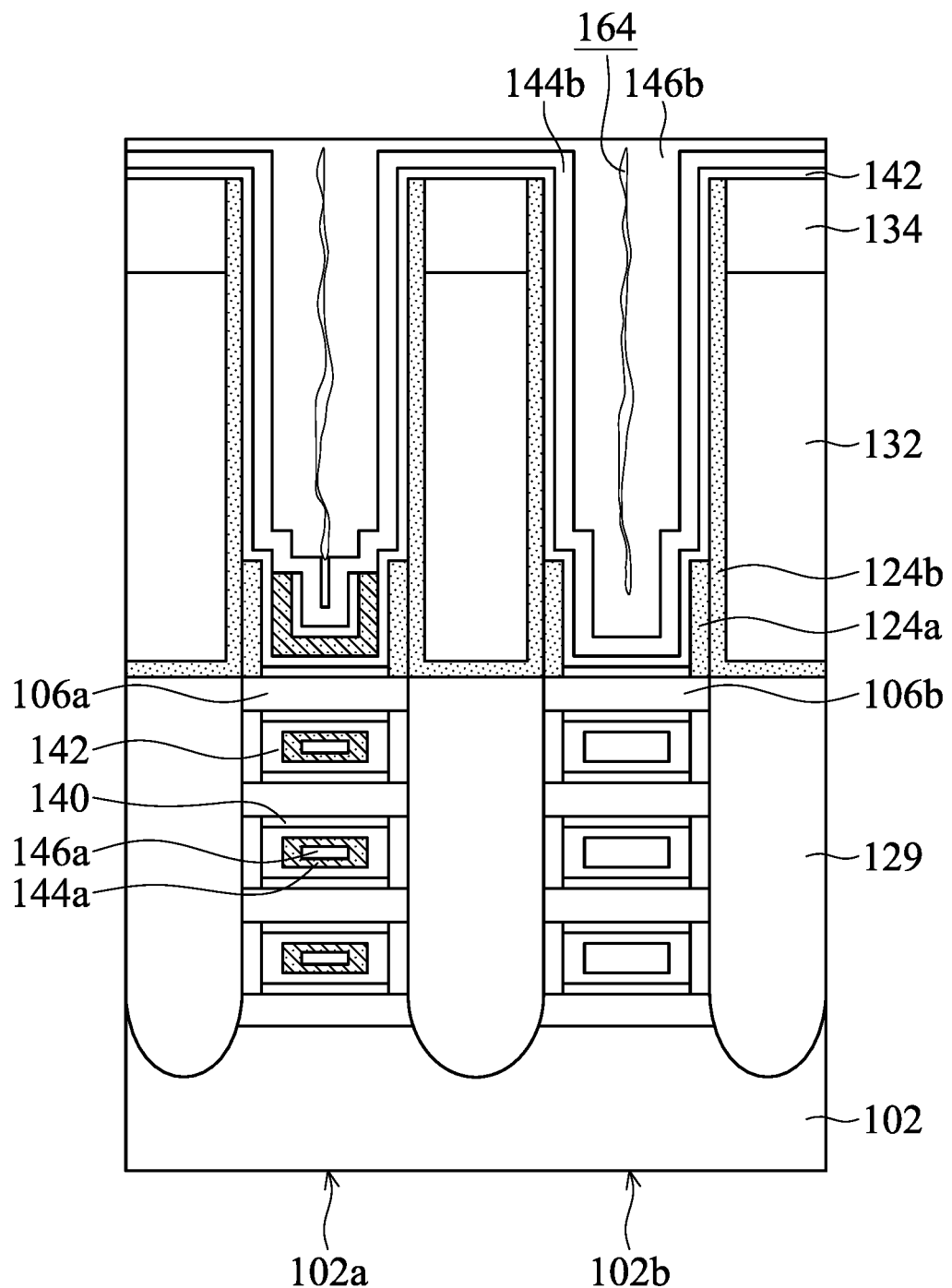
Figures 1, 4B:
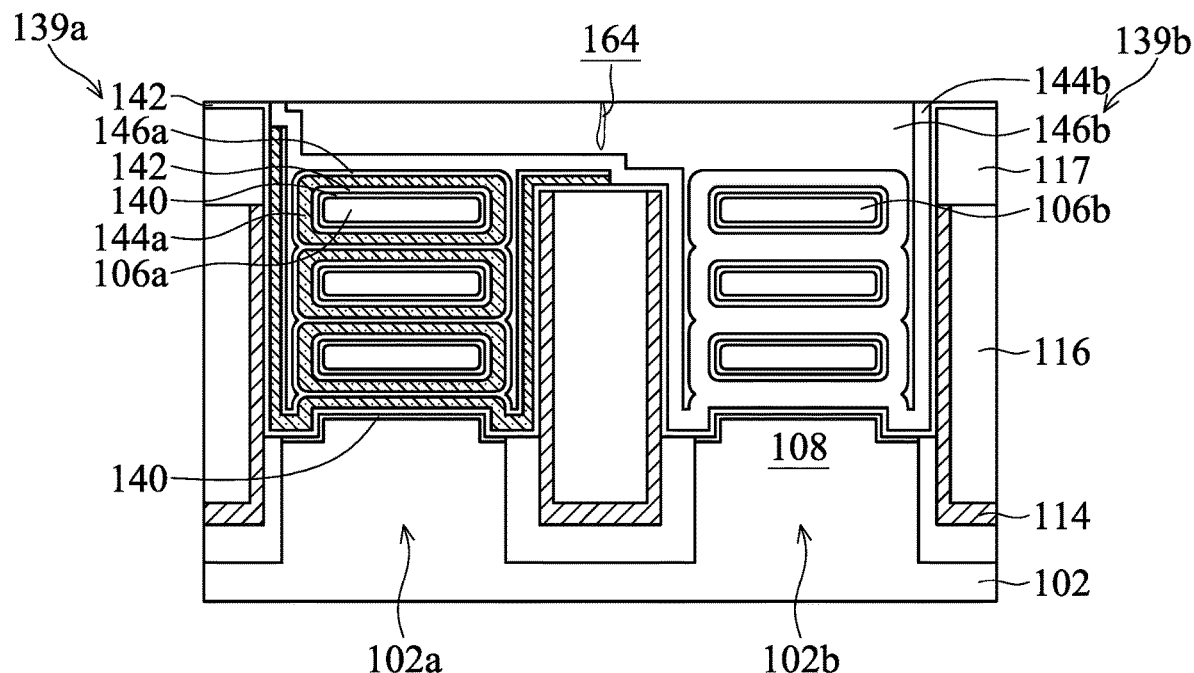
Figures 2, 4B:
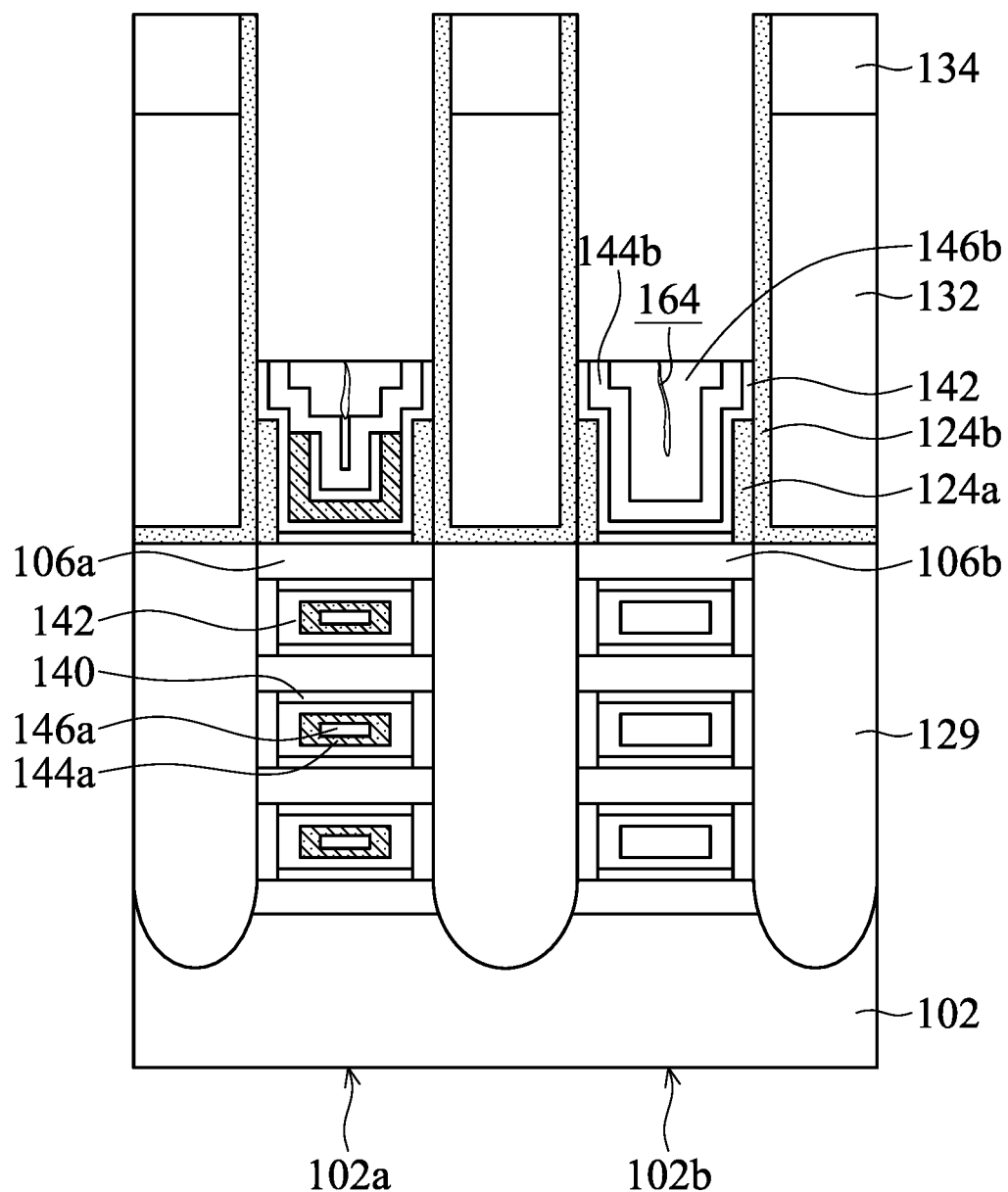
Figures 1, 4C:
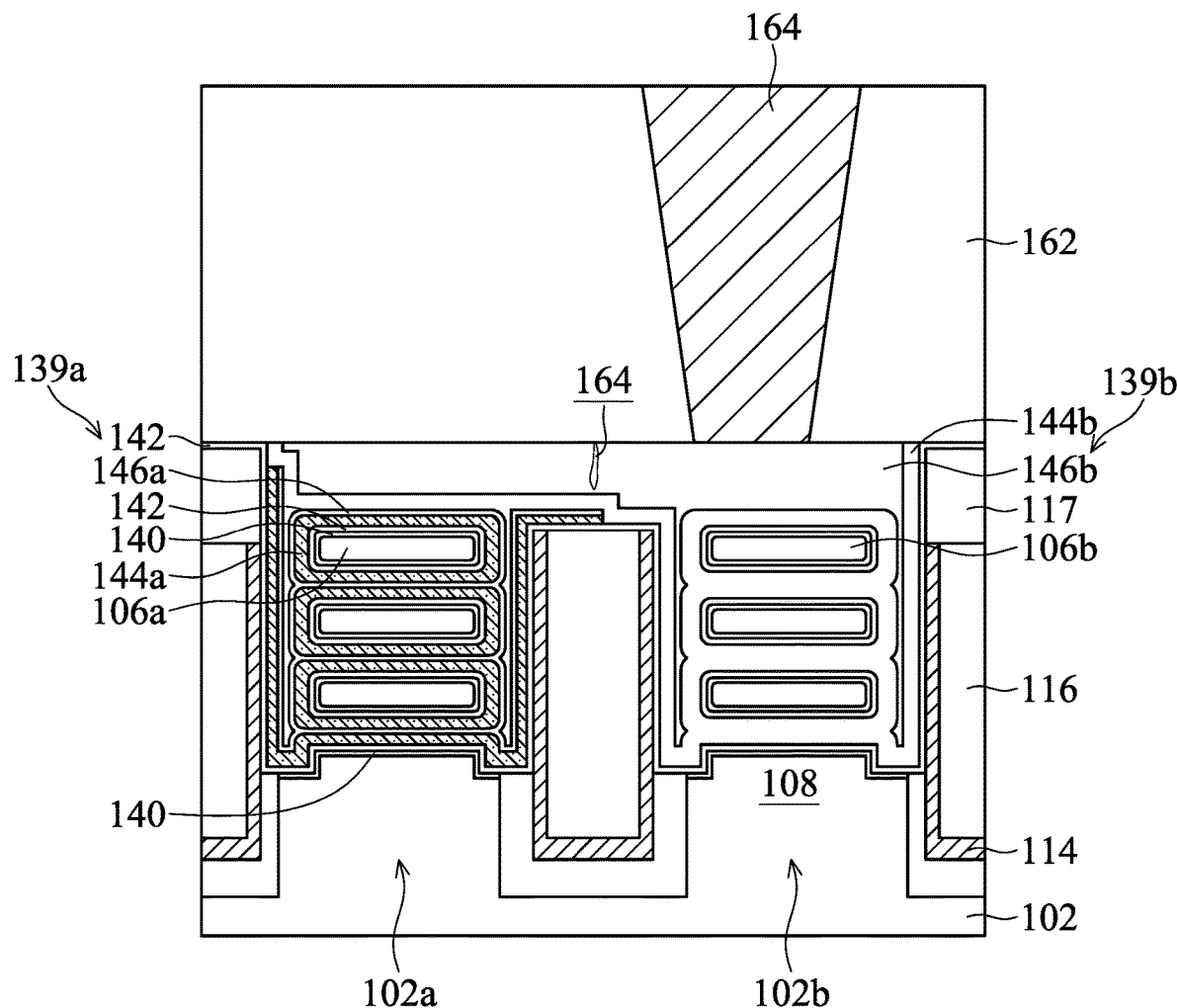
Figures 2, 4C:
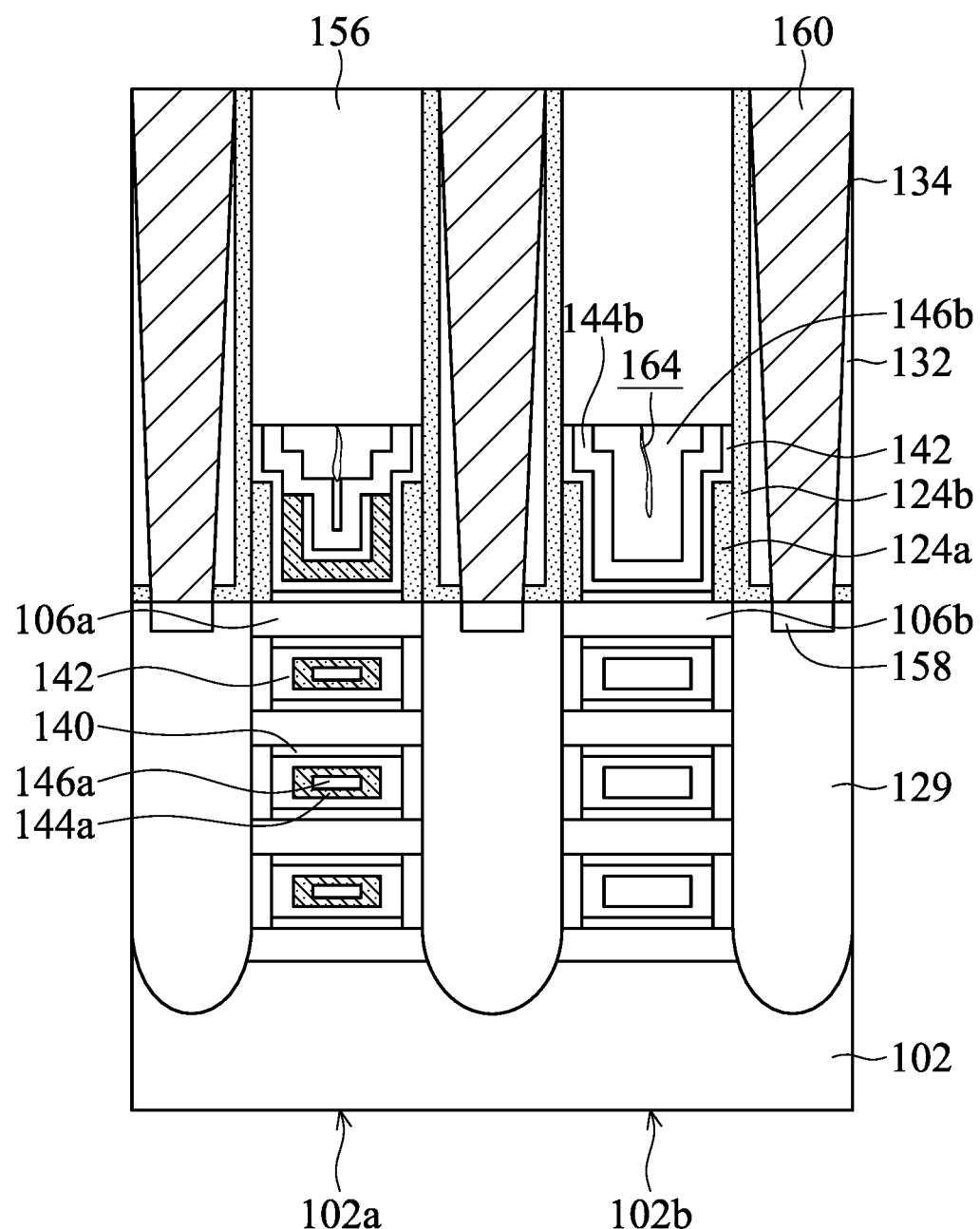

Next, the second metal gate layer 144b and the second glue layer 146b are etched back, and the cap layer 156 is formed over the second metal gate layer 144b and the second glue layer 146b, as shown in FIGS. 4B-2 and 4C-2 in accordance with some embodiments. The processes for removing the second metal gate layer 144b and forming the cap layer 156 may be the same as, or similar to, those used to remove the second metal gate layer 144b and forming the cap layer 156 in the previous embodiments. For the purpose of brevity, the descriptions of these processes are not repeated herein.

Figure 5:
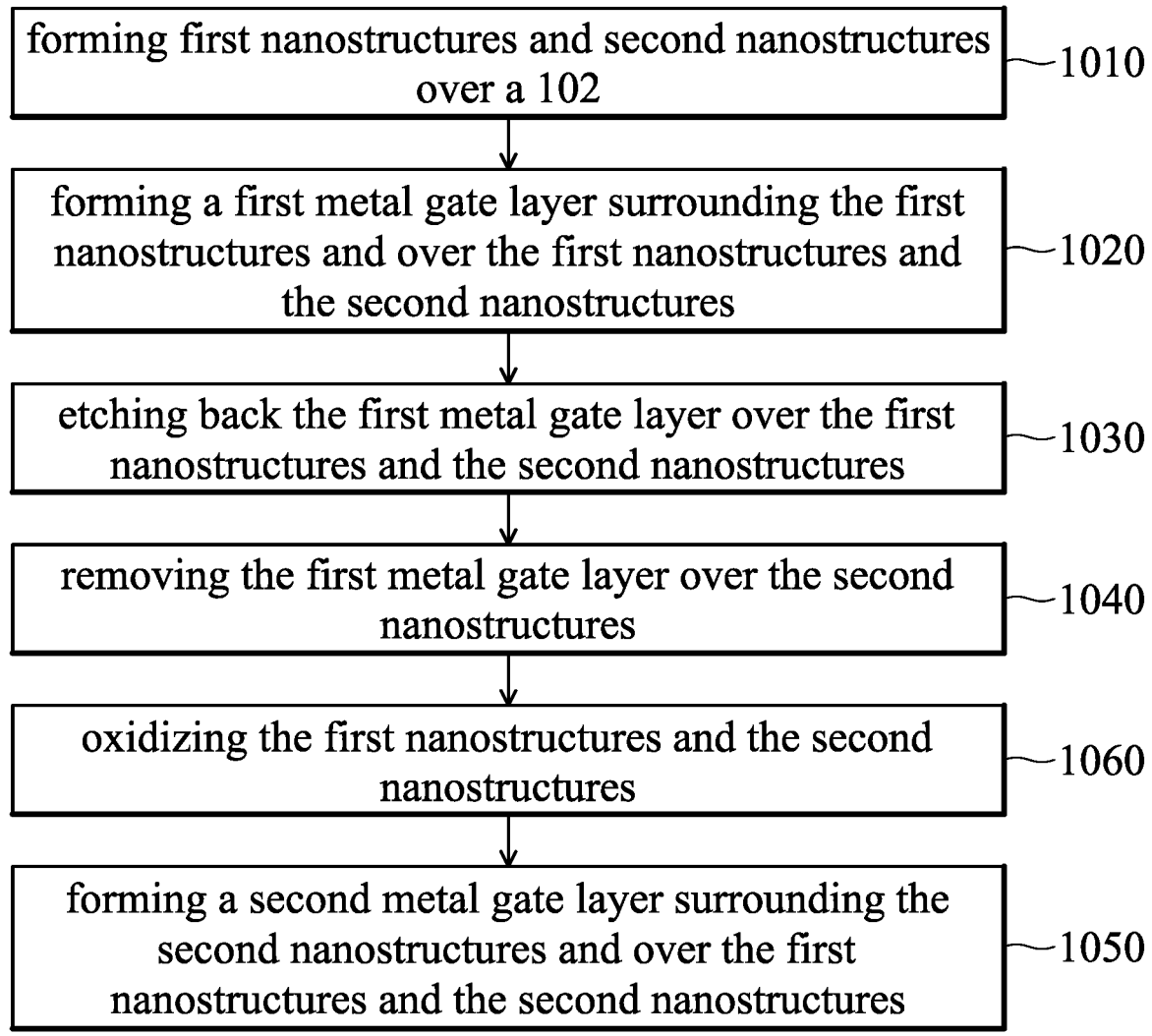
FIG. 5 is a flow chart of forming a semiconductor device structure, in accordance with some embodiments of the disclosure.

With etching back the first metal gate layer 144a before forming the second metal gate layer 144b, only the second metal gate layer 144b is etched back when forming the cap layer 156. Therefore, it may be easier to control the gate height and avoid over-etching the first metal gate layer 144a and the second metal gate layer 144b. The loading effect between different regions 102a and 102b may be reduced, and the yield may be improved. The seam 164 formed in the second metal gate layer 144b may not cause punch through when etching back the second metal gate layer 144b Many variations and/or modifications may be made to the embodiments of the disclosure. FIG. 5 is a flow chart of forming a semiconductor device structure 10c, in accordance with some embodiments of the disclosure. FIGS. 6A-1, 6A-2, 6B-1, 6B-2 are cross-sectional representations of various stages of forming a semiconductor device structure 10c, in accordance with some embodiments of the disclosure. Some processes or devices are the same as, or similar to, those described in the embodiments above, and therefore the descriptions of these processes and devices are not repeated herein. The difference from the embodiments described above is that the nanostructures 106a and 106b are oxidized before forming the second metal gate layer 144b.

Figures 1, 6A:
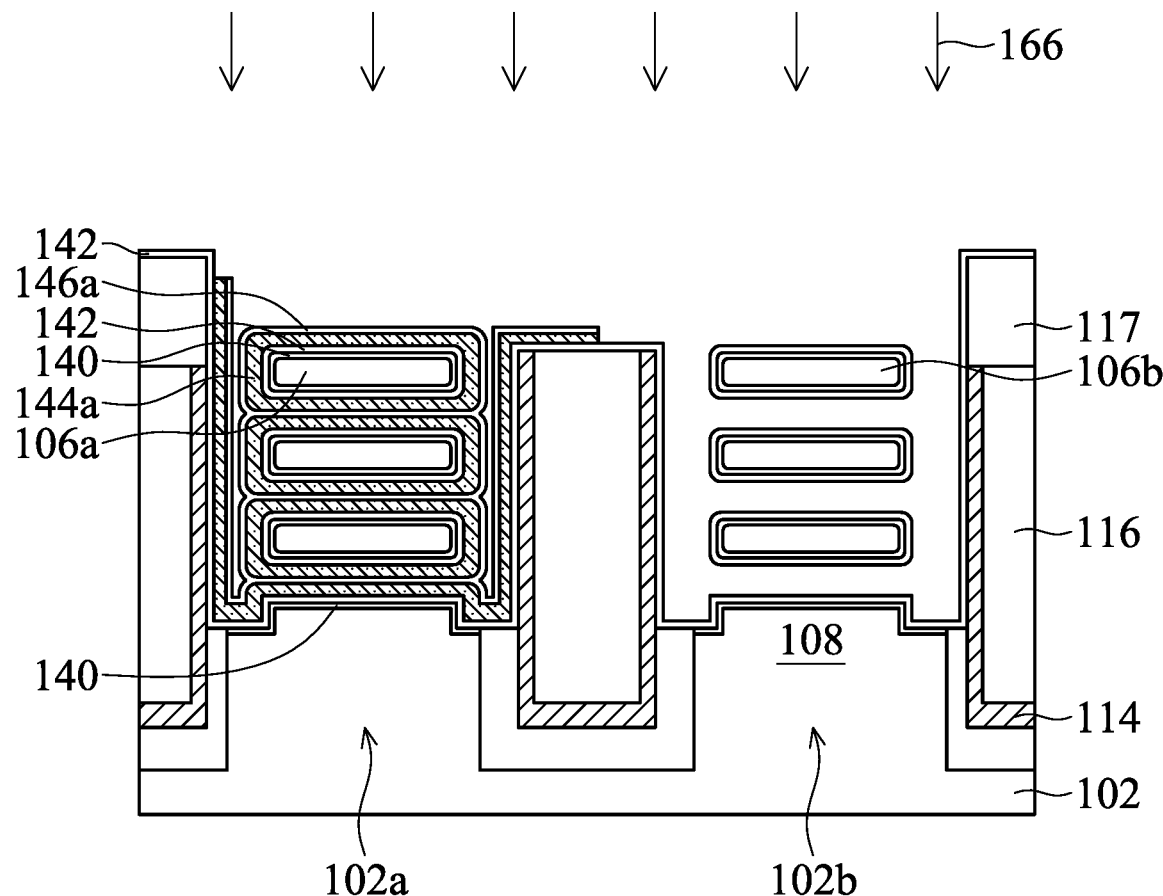
Figures 2, 6A:
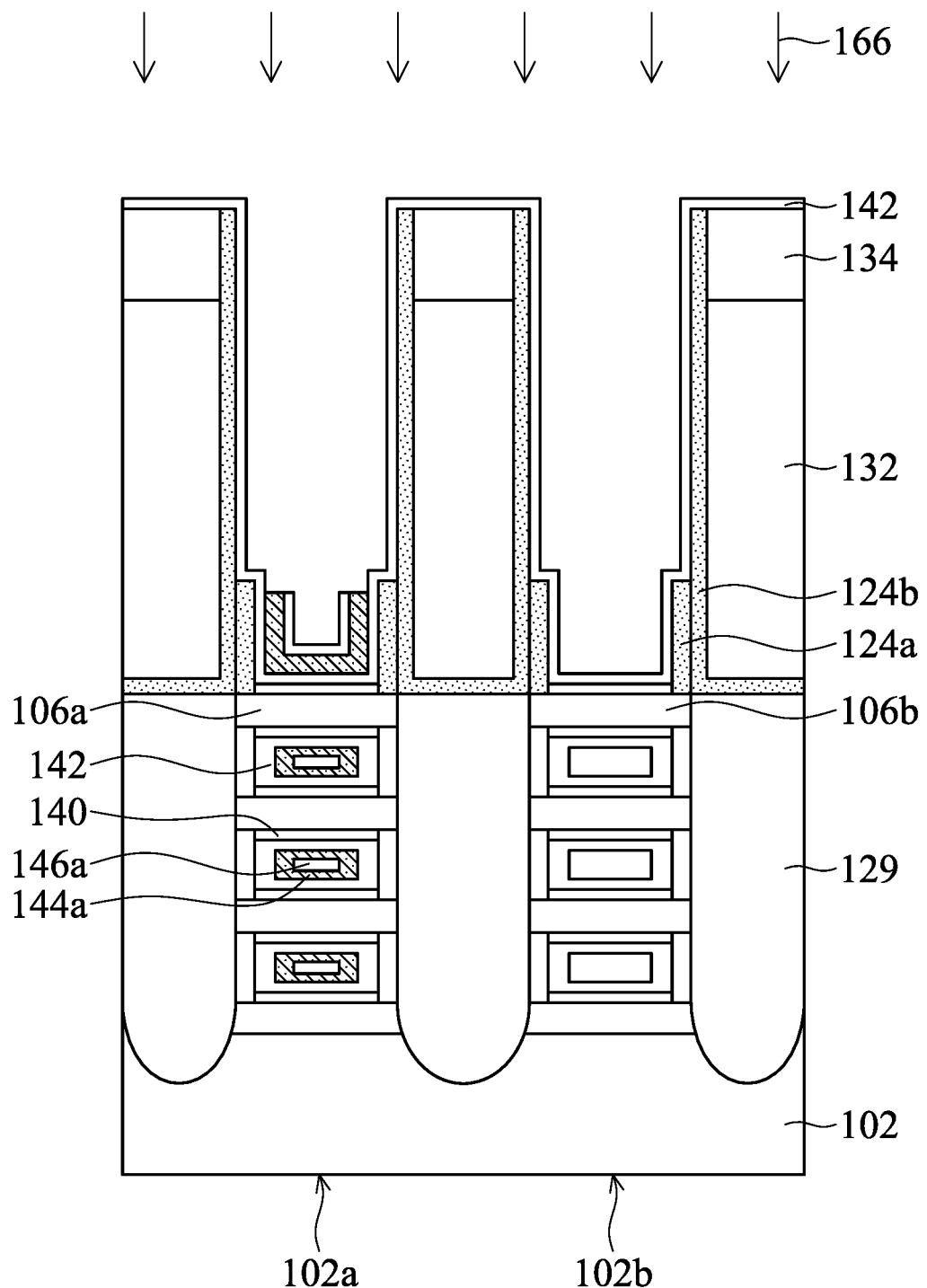

Referring to FIG. 5, in step 1060, the nanostructures 106a and 106b are oxidized. In some embodiments as shown in FIGS. 6A-1 and 6A-2, an oxidation process 166 is performed after the first metal gate layer 144a and the filling structure 138 in the second region 102b are removed. The oxidation process 166 may be a thermal treatment process. The surface quality may be improved after the oxidation process 166, and it may be easier to form the second metal gate layer 144b after the oxidation process 166. The temperature of the oxidation process 166 may be in a range of about 450° C. to about 650° C. If the temperature of the oxidation process 166 is too high, the thermal budget may be limited and the threshold voltage may be shifted. If the temperature of the oxidation process 166 is too low, the surface roughness may be worse.

Figures 1, 6B:
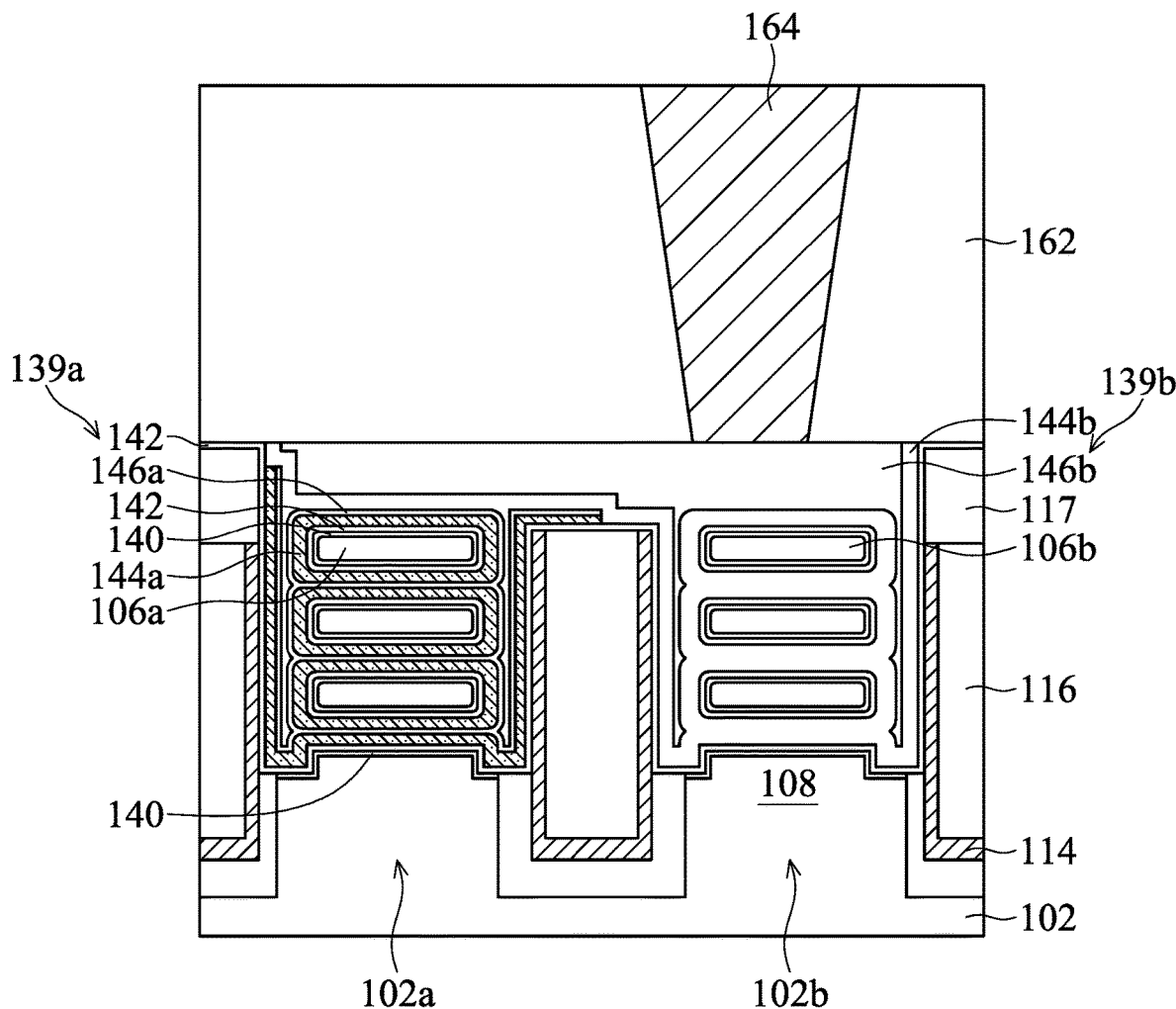
Figures 2, 6B:
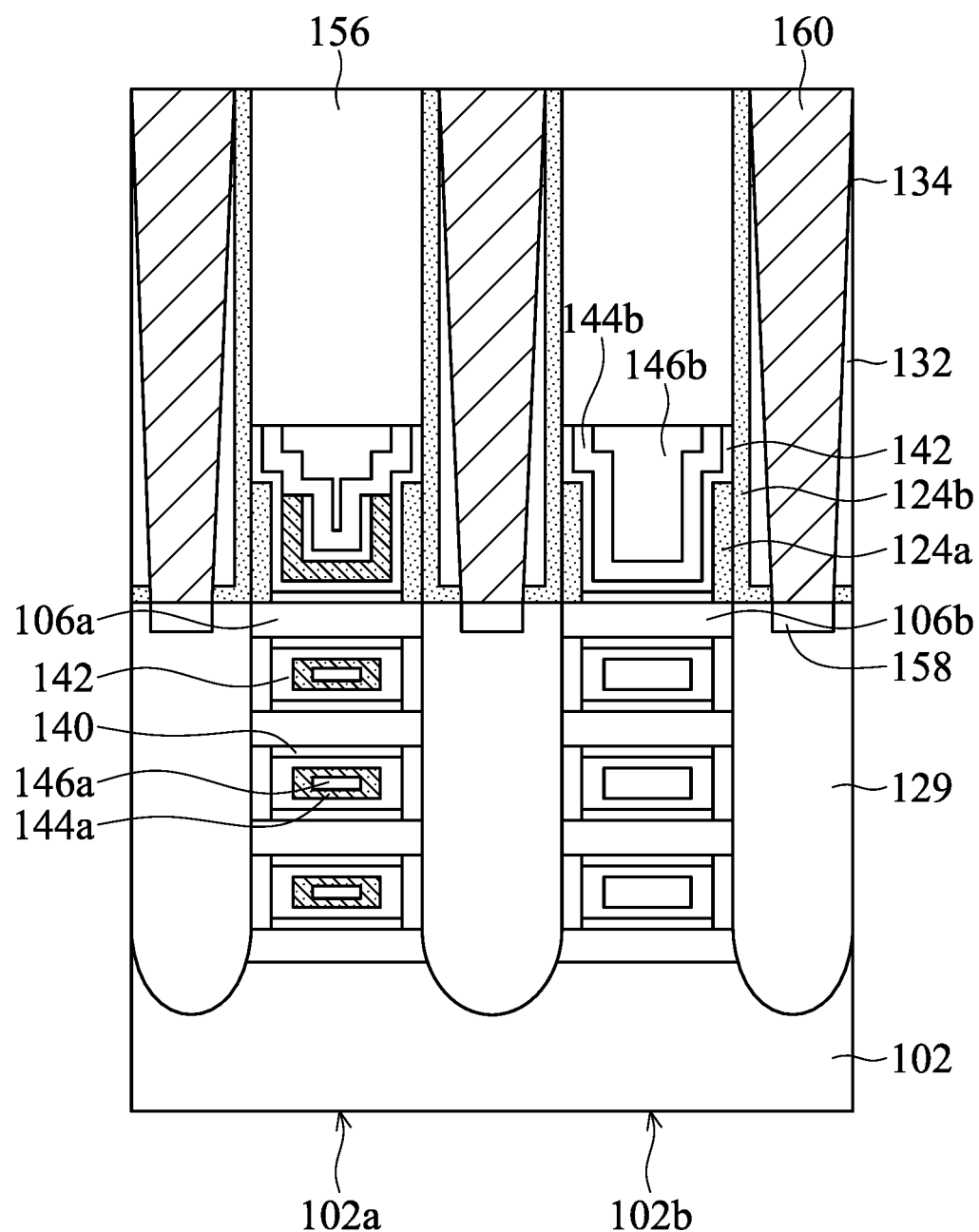

Next, the second metal gate layer 144b and the second glue layer 146b are formed, the second metal gate layer 144b and the second glue layer 146b are etched back, and the cap layer 156 is formed over the second metal gate layer 144b and the second glue layer 146b, as shown in FIGS. 6B-1 and 6B-2 in accordance with some embodiments. The processes for forming and removing the second metal gate layer 144b and forming the cap layer 156 may be the same as, or similar to, those used to form and to remove the second metal gate layer 144b and forming the cap layer 156 in the previous embodiments. For the purpose of brevity, the descriptions of these processes are not repeated herein.

With etching back the first metal gate layer 144a before forming the second metal gate layer 144b, only the second metal gate layer 144b is etched back when forming the cap layer 156. Therefore, it may be easier to control the gate height and avoid over-etching the first metal gate layer 144a and the second metal gate layer 144b. The loading effect between different regions 102a and 102b may be reduced, and the yield may be improved. With performing an oxidation process 166 before forming the second metal gate layer 144b, the surface quality may be better, and it may be easier to form the second metal gate layer 144b.

As described previously, the first metal gate layer 144a is etched back before depositing the second metal gate layer 144b. Therefore, the metal gate height may be easier controlled and the loading effect between different regions 102a and 102b may be prevented. The production yield may be improved. In some embodiments as shown in FIG. 4A-2, a seam 164 is formed in the second glue layer 146b. The seam 164 formed in the second metal gate layer 144b does cause punch through when etching back the second metal gate layer 144b. In some embodiments as shown in FIGS. 6A-1 and 6A-2, an oxidation process 166 is performed before depositing the second metal gate layer 144b. The surface quality is improved by the oxidation process 166.

Embodiments of a semiconductor device structure and a method for forming the same are provided. The first metal gate layer is etched back before forming the second metal gate layer. Therefore, only the second metal gate layer is etched during forming the cap layer for the self-aligned-contact process. The loading effect for etching back the metal gate layers in different regions may be prevented and the metal gate height may be well controlled.

In some embodiments, a method for forming a semiconductor device structure is provided. The method for forming a semiconductor device structure includes forming first nanostructures and second nanostructures over a substrate. The method for forming a semiconductor device structure also includes forming a first metal gate layer surrounding the first nanostructures and over the first nanostructures and the second nanostructures. The method for forming a semiconductor device structure also includes etching back the first metal gate layer over the first nanostructures and the second nanostructures. The method for forming a semiconductor device structure also includes removing the first metal gate layer over the second nanostructures. The method for forming a semiconductor device structure also includes forming a second metal gate layer surrounding the second nanostructures and over the first nanostructures and the second nanostructures.

In some embodiments, a method for forming a semiconductor device structure is provided. The method for forming a semiconductor device structure includes forming a fin structure with alternating stacked first semiconductor layers and second semiconductor layers over a substrate. The method for forming a semiconductor device structure also includes removing the first semiconductor layers to form a gate opening between the second semiconductor layers. The method for forming a semiconductor device structure also includes depositing a first metal gate layer in the gate opening surrounding the second semiconductor layers. The method for forming a semiconductor device structure also includes removing the top portion of the first metal gate layer. The method for forming a semiconductor device structure also includes removing the first metal gate layer in a second region of the substrate. The method for forming a semiconductor device structure also includes depositing a second metal gate layer in the gate opening surrounding the second semiconductor layers in the second region of the substrate.

In some embodiments, a semiconductor device structure is provided. The semiconductor device structure includes first nanostructures and second nanostructures formed over a substrate. The semiconductor device structure further includes a first metal gate layer surrounding the first nanostructures. The semiconductor device structure further includes a second metal gate layer surrounding the second nanostructures and over the first metal gate layer. The second metal gate layer is in contact with the top surface of the first metal gate layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming first nanostructures and second nanostructures over a substrate;
   forming a first metal gate layer surrounding the first nanostructures and over the first nanostructures and the second nanostructures;
   etching back the first metal gate layer over the first nanostructures and the second nanostructures;
   removing the first metal gate layer over the second nanostructures; and
   forming a second metal gate layer surrounding the second nanostructures and over the first nanostructures and the second nanostructures.

2. The method for forming the semiconductor device structure as claimed in claim 1, further comprising:
   etching back the second metal gate layer,
   wherein the first metal gate layer is covered by the second metal gate layer after etching back the second metal gate layer.

3. The method for forming the semiconductor device structure as claimed in claim 1, further comprising:
   forming a second glue layer over the second metal gate layer,
   wherein a top portion of the second glue layer is removed when etching back the second metal gate layer.

4. The method for forming the semiconductor device structure as claimed in claim 1, further comprising:
   forming a first glue layer surrounding the first metal gate layer and over the first metal gate layer; and
   etching back the first glue layer when etching back the first metal gate layer.

5. The method for forming the semiconductor device structure as claimed in claim 1, further comprising:

forming a filling structure between the second nanostructures before forming the first metal gate layer; and
removing the filling structure when removing the first metal gate layer over the second nanostructures.

6. The method for forming the semiconductor device structure as claimed in claim 1, further comprising:
oxidizing the first nanostructures and the second nanostructures after removing the first metal gate layer over the second nanostructures.

7. A method for forming a semiconductor device structure, comprising:
forming a fin structure with alternating stacked first semiconductor layers and second semiconductor layers over a substrate;
removing the first semiconductor layers to form a gate opening between the second semiconductor layers;
depositing a first metal gate layer in the gate opening surrounding the second semiconductor layers;
removing a top portion of the first metal gate layer;
removing the first metal gate layer in a second region of the substrate; and
depositing a second metal gate layer in the gate opening surrounding the second semiconductor layers in the second region of the substrate and over the first metal gate layer in a first region of the substrate, wherein a first bottommost surface of the second metal gate layer in the first region of the substrate is higher than a second bottommost surface of the second metal gate layer in the second region of the substrate.

8. The method for forming the semiconductor device structure as claimed in claim 7, further comprising:
forming a dummy gate structure across the fin structure;
forming first spacer layers over opposite sides of the dummy gate structure;
forming second spacer layers over opposite sides of the first spacer layers; and
removing top portions of the first spacer layers before depositing the first metal gate layer.

9. The method for forming the semiconductor device structure as claimed in claim 7, further comprising:
depositing a coating layer over the first metal gate layer; and
etching back the coating layer before removing the top portion of the first metal gate layer,
wherein a top surface of the coating layer is substantially level with a top surface of the first metal gate layer after removing the top portion of the first metal gate layer.

10. The method for forming the semiconductor device structure as claimed in claim 9, further comprising:
removing the coating layer in the second region; and
removing the first metal gate layer in the second region.

11. The method for forming the semiconductor device structure as claimed in claim 7, further comprising:
forming a second glue layer over the second metal gate layer;
planarizing the second glue layer and the second metal gate layer; and
etching back the second glue layer and the second metal gate layer over the fin structure.

12. The method for forming the semiconductor device structure as claimed in claim 11, wherein a seam is formed in the second glue layer.

13. A method for forming a semiconductor device structure, comprising:
forming first nanostructures and second nanostructures over a substrate;
forming a first metal gate layer surrounding the first nanostructures;
forming a second metal gate layer surrounding the second nanostructures and over the first metal gate layer,
wherein the second metal gate layer is in contact with a top surface of the first metal gate layer, wherein the first metal gate layer comprises N-work-function metal, and the second metal gate layer comprises P-work-function metal.

14. The method for forming the semiconductor device structure as claimed in claim 13, further comprising:
forming first spacer layers over opposite sides of the first metal gate layer over the first nanostructures;
forming second spacer layers over opposite sides of the first spacer layers,
wherein the top surface of the first metal gate layer is lower than top surfaces of the first spacer layers.

15. The method for forming the semiconductor device structure as claimed in claim 14, further comprising:
forming a cap layer formed over the second metal gate layer between the second spacer layers.

16. The method for forming the semiconductor device structure as claimed in claim 13, wherein the first metal gate layer is narrower than the second metal gate layer over the first nanostructures.

17. The method for forming the semiconductor device structure as claimed in claim 13, further comprising:
forming a first glue layer surrounding the first metal gate layer,
wherein a top surface of the first glue layer is substantially level with the top surface of the first metal gate layer.

18. The method for forming the semiconductor device structure as claimed in claim 7, wherein the profile of the second metal gate layer in the first region of the substrate is different from the profile of the second metal gate layer in the second region of the substrate.

19. The method for forming the semiconductor device structure as claimed in claim 7, wherein a portion of the second metal gate layer in the first region of the substrate extends between opposite sidewalls of the first metal gate layer.

20. The method for forming the semiconductor device structure as claimed in claim 13, wherein a portion of the second metal gate layer extends between opposite sidewalls of the first metal gate layer.

* * * * *